(12) United States Patent
Okamoto et al.

(10) Patent No.: US 11,417,697 B2
(45) Date of Patent: Aug. 16, 2022

(54) IMAGING DEVICE AND IMAGING APPARATUS

(71) Applicant: CANON KABUSHIKI KAISHA, Tokyo (JP)

(72) Inventors: Kohei Okamoto, Kanagawa (JP); Koichi Fukuda, Tokyo (JP); Shunichi Wakashima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/193,699

(22) Filed: Mar. 5, 2021

(65) Prior Publication Data
US 2021/0280619 A1 Sep. 9, 2021

(30) Foreign Application Priority Data
Mar. 9, 2020 (JP) .............................. JP2020-040210

(51) Int. Cl.
| | |
|---|---|
| *H04N 5/369* | (2011.01) |
| *H01L 27/146* | (2006.01) |
| *H04N 5/378* | (2011.01) |
| *G03B 13/36* | (2021.01) |

(Continued)

(52) U.S. Cl.
CPC ............ *H01L 27/1463* (2013.01); *G02B 7/38* (2013.01); *G03B 13/36* (2013.01); *G03B 17/14* (2013.01); *H01L 27/14621* (2013.01); *H01L 27/14623* (2013.01); *H01L 27/14627* (2013.01); *H01L 27/14645* (2013.01); *H04N 5/36961* (2018.08); *H04N 5/378* (2013.01)

(58) Field of Classification Search
CPC .......... H01L 27/1463; H01L 27/14621; H01L 27/14623; H01L 27/14627; H01L 27/14645; H01L 27/14612; H01L 27/14625; G02B 7/38; G02B 7/346; G03B 13/36; G03B 17/14; H04N 5/36961; H04N 5/378
See application file for complete search history.

(56) References Cited

U.S. PATENT DOCUMENTS

| | | | |
|---|---|---|---|
| 4,410,804 | A | 10/1983 | Stauffer |
| 9,386,249 | B2 | 7/2016 | Iida et al. |

(Continued)

FOREIGN PATENT DOCUMENTS

| | | |
|---|---|---|
| JP | 58-24105 A | 2/1983 |
| JP | 2015-220279 A | 12/2015 |

*Primary Examiner* — Abdelaaziz Tissire
(74) *Attorney, Agent, or Firm* — Cowan, Liebowitz & Latman, P.C.

(57) ABSTRACT

An imaging device suitable for focus detection of a pupil division phase difference method includes: a light receiving unit provided on a first surface side of a semiconductor substrate and having a plurality of pixels arranged in a two-dimensional form; and a read-out circuit provided on a second surface side of the semiconductor substrate opposite to the first surface side and configured to read signals from the pixels. Each of pixels has at least two photoelectric conversion elements and a separation region which is a region between the two photoelectric conversion elements and a separation region control electrode arranged on the second surface side of the separation region and configured to control a potential of the separation region.

27 Claims, 26 Drawing Sheets

(51) Int. Cl.
*G03B 17/14* (2021.01)
*G02B 7/38* (2021.01)

(56) References Cited

U.S. PATENT DOCUMENTS

| | | | | |
|---|---|---|---|---|
| 2013/0107086 | A1* | 5/2013 | Nagano | H04N 5/37457 348/340 |
| 2014/0285627 | A1* | 9/2014 | Kuboi | H04N 5/357 348/241 |
| 2015/0155327 | A1* | 6/2015 | Kuboi | H01L 27/1464 257/292 |
| 2015/0255498 | A1* | 9/2015 | Sugiura | H01L 27/14623 257/432 |
| 2016/0240571 | A1* | 8/2016 | Baek | H01L 27/14625 |
| 2017/0243912 | A1* | 8/2017 | Kaneda | H01L 27/14667 |
| 2017/0345853 | A1* | 11/2017 | Kato | H04N 5/36961 |
| 2018/0061873 | A1* | 3/2018 | Lee | H01L 27/14665 |
| 2018/0301487 | A1* | 10/2018 | Lee | H01L 27/14636 |
| 2018/0301509 | A1* | 10/2018 | Ishii | H01L 27/14636 |
| 2018/0350856 | A1* | 12/2018 | Masagaki | H01L 27/14641 |
| 2019/0131340 | A1* | 5/2019 | Kim | H01L 27/14621 |

* cited by examiner

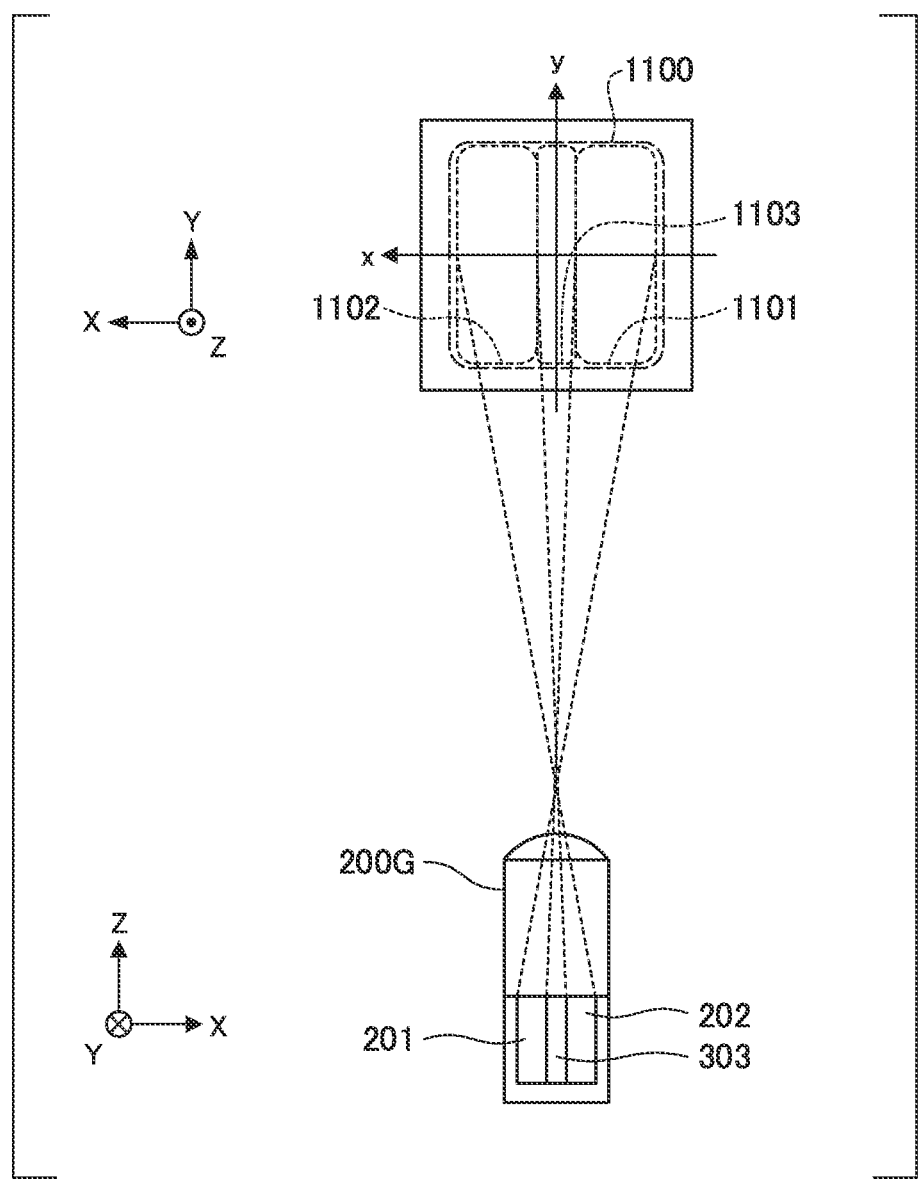

IMAGING DEVICE AND IMAGING APPARATUS

BACKGROUND OF THE INVENTION

Field of the Invention

The present invention relates to an imaging device suitable for focus detection, and the like.

Description of the Related Art

As one of the focus detection methods performed using an imaging apparatus, there is an imaging surface phase difference method in which focus detection of a phase difference method is performed through a focus detection pixel formed on an imaging device.

As an example of such an imaging surface phase difference method, Japanese Patent Laid-Open No. S58-24105 discloses an imaging apparatus in which a two-dimensional imaging device including one microlens and a plurality of separate photoelectric conversion elements formed for one pixel is utilized. The plurality of photoelectric conversion elements are configured to receive light transmitted through different regions of an exit pupil of an imaging lens via one microlens and undergo pupil division. It is possible to perform the focus detection of the phase difference method by calculating an amount of image deviation from a parallax signal which is a signal of each of the photoelectric conversion elements. Furthermore, it is possible to acquire an image from an imaging signal obtained by adding a signal of each of the photoelectric conversion elements for each pixel.

Japanese Patent Laid-Open No. 2015-220279 proposes an imaging pixel of a pupil division phase difference method in which electrically-divided photoelectric conversion elements are used as a light receiving unit in one pixel and has a configuration in which a voltage of this portion is controlled using an electrode provided on a light incident side of a divided portion of each of the photoelectric conversion elements. According to this configuration, it is possible to change a height and a width of a potential barrier corresponding to the divided portion of the photoelectric conversion element through voltage control of an electrode.

Since a crosstalk rate of electric charges between photoelectric conversion elements which are electrically separated from each other depends on the height and the width of the potential barrier is changed, it is possible to control an amount of signals from each of the photoelectric conversion elements. Since this amount of signals is linked to the pupil division performance of the pupil division phase difference method, it is possible to change the pupil division performance through such a configuration.

However, the provision of the electrode on the light incident side of the photoelectric conversion element causes a loss due to scattering and absorption of incident light, reduces the light receiving efficiency of the imaging device, and significantly reduces the accuracy of the pupil division performance of the pupil division phase difference method. In the related art, in the imaging device in which the focus detection of the pupil division phase difference method is performed, an amount of optical crosstalk between the divided photoelectric conversion elements varies due to variations in film thickness of a photoelectric conversion element during production. Thus, since there are variations in the pupil division performance of the imaging device among individual devices in the conventional technique, a large variation may occur in many cases and it is difficult to correct individual variations in the imaging device and an imaging pixel structure in which the imaging device is formed.

Even if an amount of charge crosstalk is controlled using a voltage of the divided portion which is a conventional technique to correct the variation, the above-described problems such as reduction in efficiency and reduction in accuracy still remain. Furthermore, since an exit pupil distance differs depending on an imaging optical system which is installed, the focus detection accuracy is reduced due to deviation of a pupil distance.

An object of the present invention is to provide an imaging device in which such problems in the conventional technique are solved and which is suitable for focus detection of a pupil division phase difference method.

SUMMARY OF THE INVENTION

In order to achieve the above object, an imaging device according to an aspect of the present invention includes: a light receiving unit provided on a first surface side of a semiconductor substrate and having a plurality of pixels arranged in a two-dimensional form; and a read-out circuit provided on a second surface side of the semiconductor substrate opposite to the first surface side and configured to read signals from the pixels, wherein each of the pixels has at least two photoelectric conversion elements and a separation region which is a region between the two photoelectric conversion elements, and a separation region control electrode disposed on the second surface side of the separation region and configured to control a potential of the separation region.

Further features of the present invention will become apparent from the following description of exemplary embodiments with reference to the attached drawings.

BRIEF DESCRIPTION OF THE DRAWINGS

FIG. 2 is a schematic diagram of a pixel arrangement of a pixel array in the first embodiment or the like.

FIG. 4 is a schematic diagram illustrating a cross section of the pixel of the imaging device in the first embodiment or the like.

FIG. 5 is a schematic diagram illustrating a potential distribution of a light receiving unit in the first embodiment or the like.

FIGS. 6A and 6B are schematic diagrams illustrating a potential distribution of a light receiving unit in a direction shown in e-e' in FIG. 4 in the first embodiment or the like.

FIG. 7 is a schematic diagram illustrating a relationship between a cross section structure of a pixel and an exit pupil surface of an imaging optical system in the first embodiment or the like.

DESCRIPTION OF THE EMBODIMENTS

Figure 1:
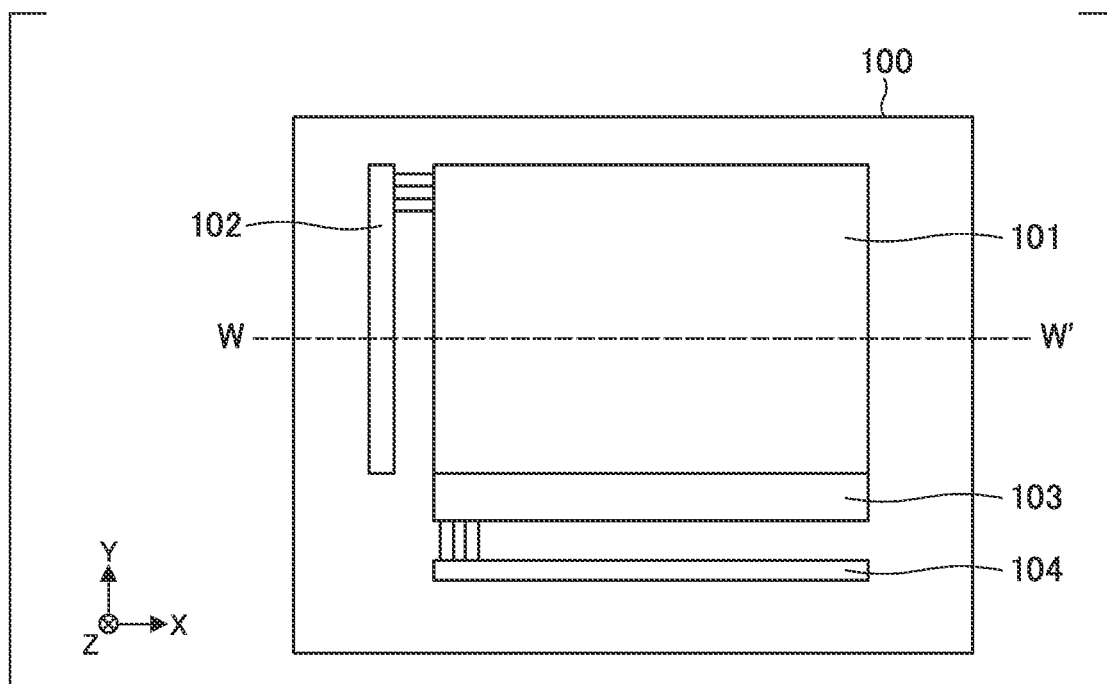
FIG. 1 is a schematic diagram illustrating an overall configuration of an imaging device in a first embodiment and the like of the present invention.

Preferred embodiments of the present invention will be described below with reference to the accompanying drawings using embodiments. In each of the drawings, the same member or constituent elements will be denoted by the same reference numerals and duplicate description thereof will be omitted or simplified.

In the embodiments, an example in which the present invention is applied to a digital still camera as an imaging apparatus will be described. However, the imaging apparatus includes electronic machines and the like having imaging functions such as digital movie cameras, smartphones with a camera, tablet computers with a camera, in-vehicle cameras, and network cameras.

First Embodiment

An example of a specific configuration of an imaging device in a first embodiment of the present invention will be described below.

FIG. 1 is a schematic diagram illustrating an overall configuration of a CMOS type imaging device 100 in the first embodiment of the present invention.

The imaging device 100 includes a pixel array unit 101, a vertical scanning circuit 102, a column circuit 103, and a horizontal scanning circuit 104.

The pixel array unit 101 constitutes a light receiving unit in which pixels for photoelectric conversion are arranged in a two-dimensional form on a first surface (a light receiving surface) side of a semiconductor substrate. When an output of the vertical scanning circuit 102 is input to a pixel, a pixel selection switch is turned on and pixel signals in a prescribed row are read into the column circuit 103 via vertical signal lines (not shown). One vertical signal line can be provided for each pixel row or for each of a plurality of pixel rows, or a plurality of vertical signal lines can be provided for each pixel row. Signals read out in parallel from a plurality of vertical signal lines are input to the column circuit 103. The column circuit 103 performs processing such as amplification, noise removal, AD conversion, and the like for a signal.

The pixel selection switch and the like constitute a read-out circuit configured to read out a signal from the pixel and the read-out circuit, wirings for the same, and the like are provided on a second surface side of the semiconductor substrate opposite to the first surface side (light receiving surface side).

The horizontal scanning circuit 104 sequentially outputs signals held in the column circuit 103 to a horizontal output line (not shown) at arbitrary or the same times.

The two-dimensional imaging signal (or a phase difference signal which will be described later) is read as a row-by-row pixel signal selected using the vertical scanning circuit 102 and digitally converted and held using the column circuit 103. Subsequently, the digital signals held using the column circuit are sequentially output outside of the imaging device 100 through the horizontal scanning circuit 104 via an output unit (not shown) for each column. A plurality of lines of video signals are read out from the imaging device 100 over one vertical period by sequentially performing the above-described operations while the lines selected using the vertical scanning circuit 102 deviate for each horizontal period.

Figure 2:
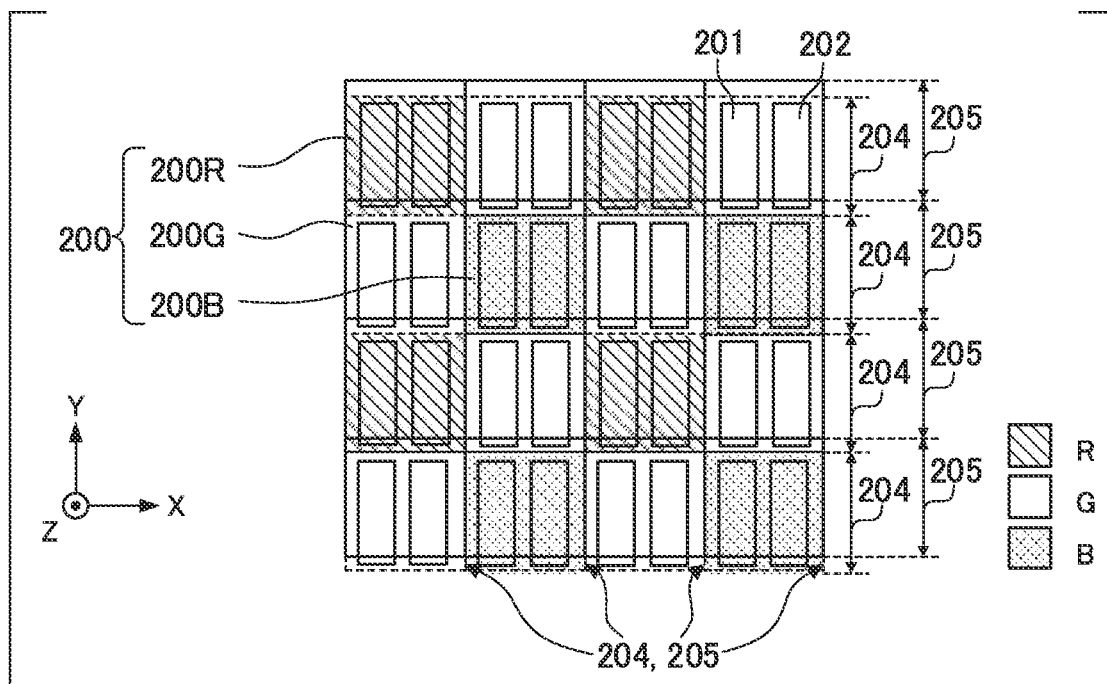

FIG. 2 is a schematic diagram illustrating a pixel arrangement of the pixel array unit 101 and it is possible to acquire an imaging signal and a focus detection signal by arranging a large number of pixels of 4 columns×4 rows shown in FIG. 2 on a plane. A Cartesian coordinate system in which a direction perpendicular to the paper surface in FIG. 2 is defined as a z direction, a leftward/rightward direction on the paper surface is defined as an x direction, an upward/downward direction is defined as a y direction, and the x, y, and z axes are used is defined.

A pixel group 200 is a unit block composed of four pixel portions of 2 rows×2 columns. A pixel 200R having a spectral sensitivity of R and utilizing a R (red) filter is located at the upper left and pixels 200G having a spectral sensitivity of G are located at the upper right and the lower left using G (green) filters. A pixel 200B having the spectral sensitivity of B is located at the lower right using a B (blue) filter.

A light receiving unit of each of the pixels includes an n-type semiconductor photodiode (PDA A) 201 and photodiode (PDB B) 202 as two photoelectric conversion elements and a separation region 303 which is a region between the two photoelectric conversion elements. The separation region 303 is doped with impurities of a p-type semiconductor which is a conductive type semiconductor different from that of the photoelectric conversion element. Furthermore, a concentration distribution of the impurities is a maximum at a center of the separation region 303 in the x direction. In addition, the center of the separation region 303 coincides with a center of a pixel.

In one pixel portion, a PD which is a photoelectric conversion element disposed on a side on which an x-coordinate value is relatively small is referred to as a "PDA 201" and a PD which is a photoelectric conversion element arranged on a side on which the x-coordinate value is relatively large is referred to as a "PDB 202". The PDA 201 and the PDB 202 are PDs configured to perform photoelectric conversion and accumulation.

Also, a pixel boundary between photoelectric conversion elements is denoted by reference numeral 205 and a pixel boundary between optical members including a microlens, a color filter, and a light-shielding wall is denoted by reference numeral 204. As illustrated in FIG. 2, the pixel boundary between the photoelectric conversion elements deviates from the pixel boundary between the optical members in the y direction. However, the pixel boundary between the photoelectric conversion elements substantially coincides with the pixel boundary between the optical members in the x direction.

Figure 3A:
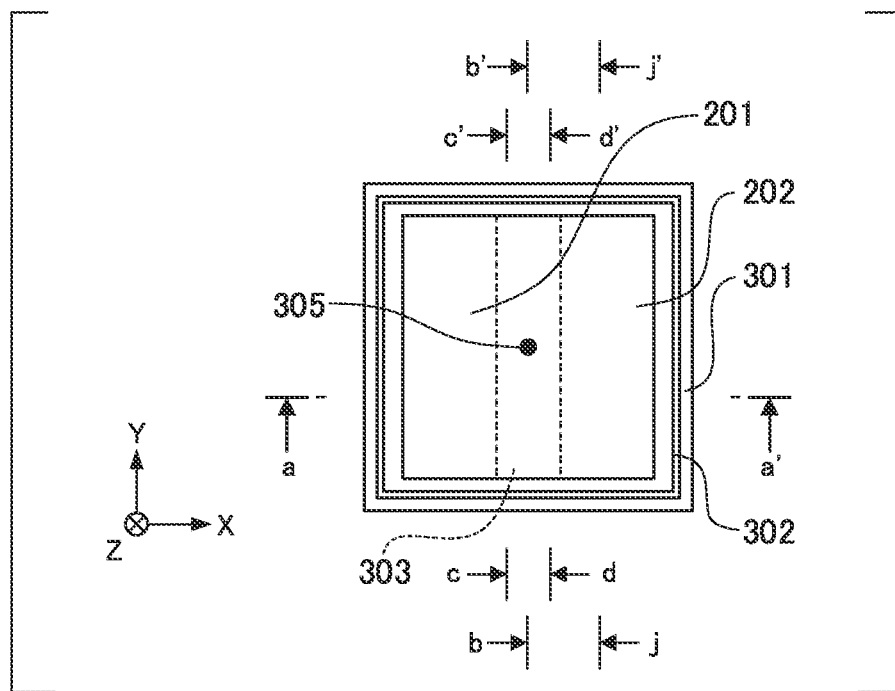
FIGS. 3A and 3B are schematic diagrams illustrating a surface of a pixel of the imaging device.
Figure 3B:
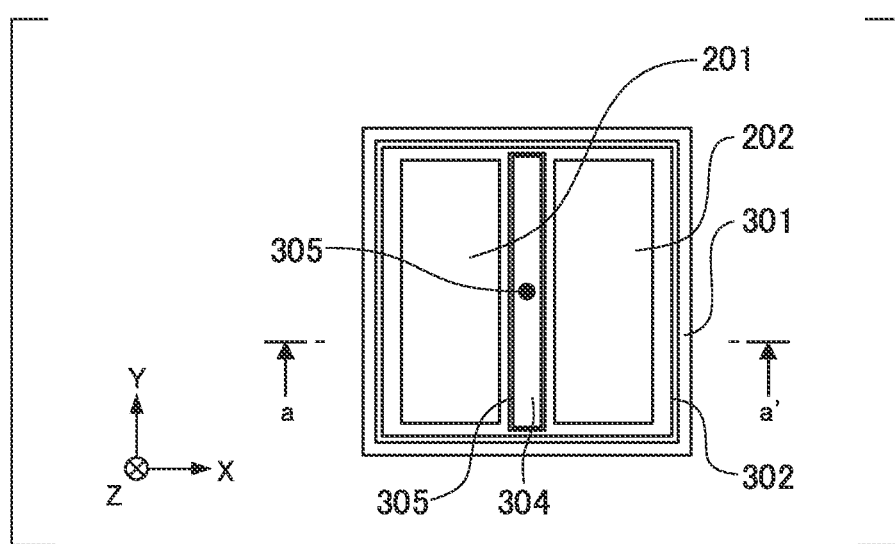
Figure 4:
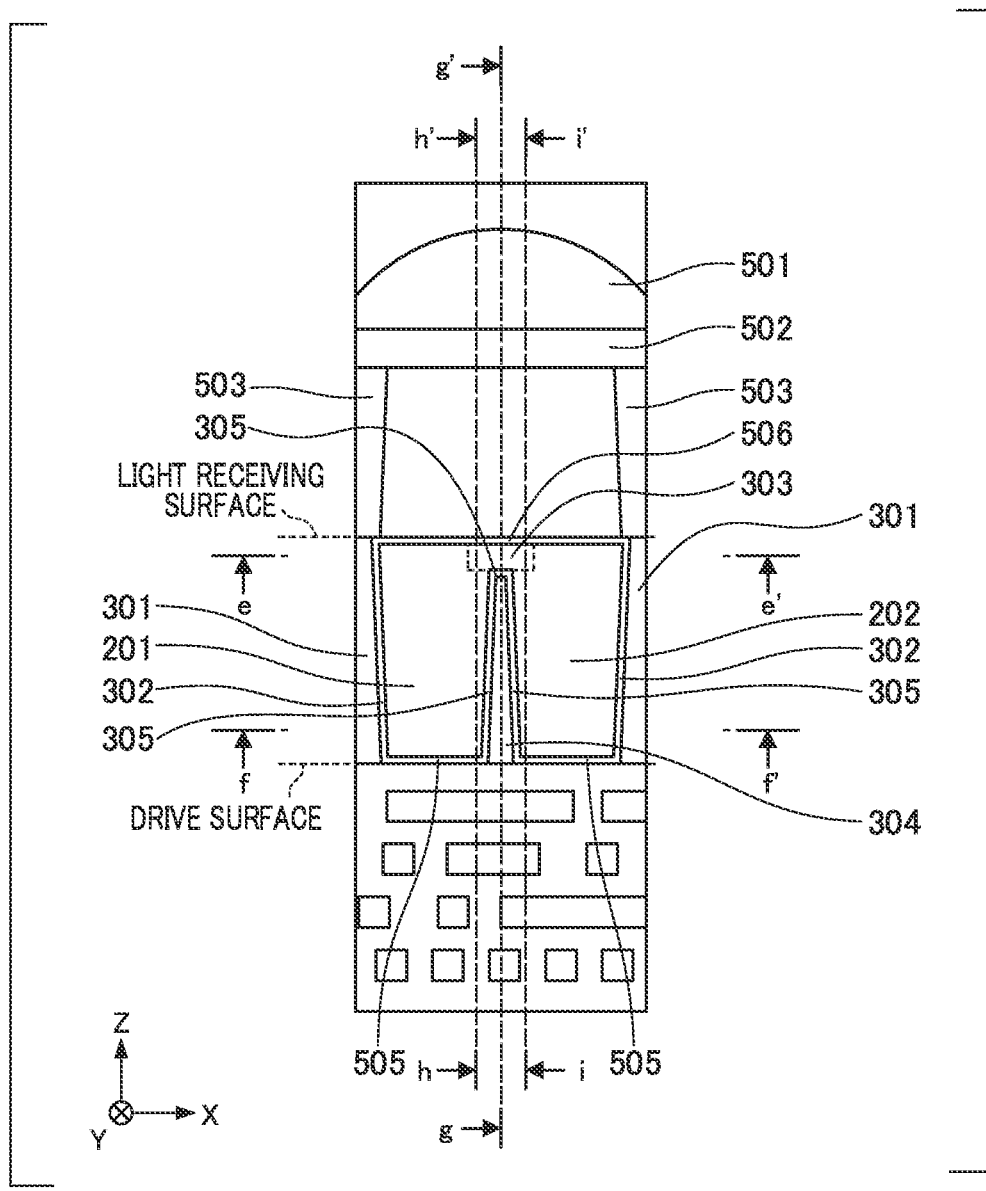

FIGS. 3A and 3B are schematic diagrams illustrating a plane of a pixel of the imaging device in the first embodiment and is a diagram of one pixel 200G of the pixel arrangement illustrated in FIG. 2 when viewed from the light receiving surface side (+z side) of the imaging device 100. FIG. 4 is a schematic diagram illustrating a cross section of a pixel of the imaging device in the first embodiment and a cross-sectional view of an a-a' cross section in FIGS. 3A and 3B when viewed from the −y side. FIG. 3A corresponds to an e-e' cross section in FIG. 4 and FIG. 3B corresponds to an f-f' cross section in FIG. 4.

Figure 5:
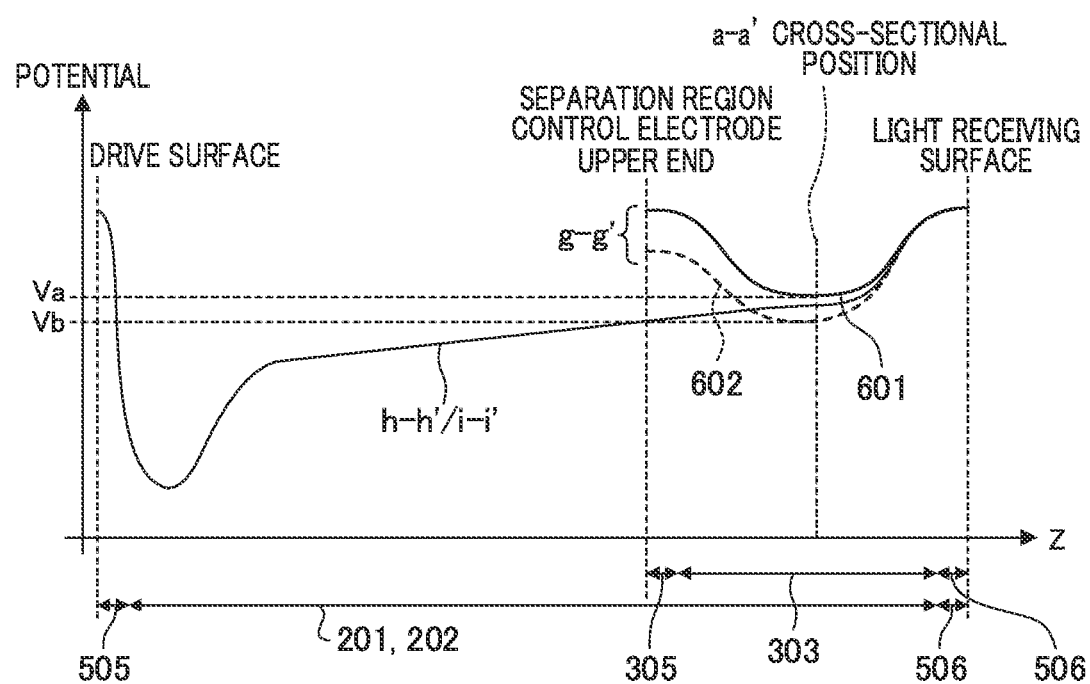

FIG. 5 is a schematic diagram illustrating a potential distribution of the light receiving unit in the first embodiment and schematically illustrates potential distributions in g-g', h-h', and i-i' line segments in FIG. 4 and in the light receiving unit. A potential distribution 601 indicates a case in which a voltage of a separation region control electrode 304 is relatively low and a potential distribution 602 indicates a case in which a voltage of the separation region control electrode 304 is relatively high. If the voltage of the separation region control electrode 304 is relatively high in this way, it is possible to reduce the potential barrier of the separation region between the PDA 201 and the PDB 202 and increase crosstalk.

Figure 6A:
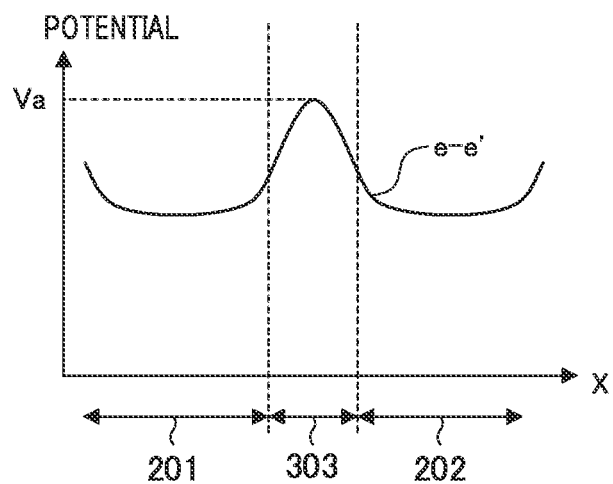
Figure 6B:
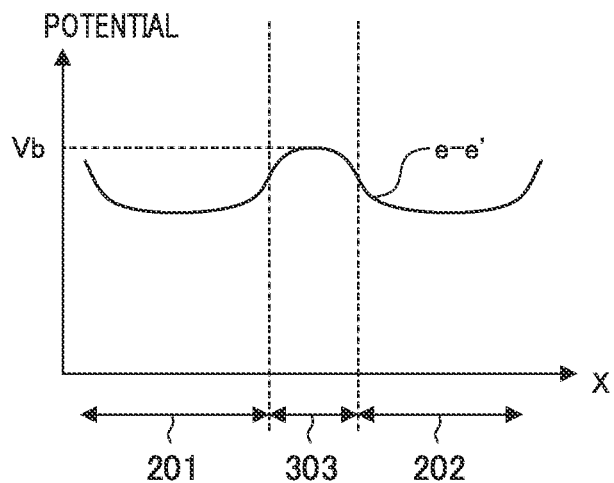

FIGS. 6A and 6B are schematic diagrams illustrating a potential distribution of the light receiving unit in the x direction shown in e-e' in FIG. 4, FIG. 6A is a diagram illustrating a case in which a voltage of the separation region control electrode 304 is relatively low, and FIG. 6B is a diagram illustrating a case in which the voltage of the separation region control electrode 304 is relatively high.

Figure 12:
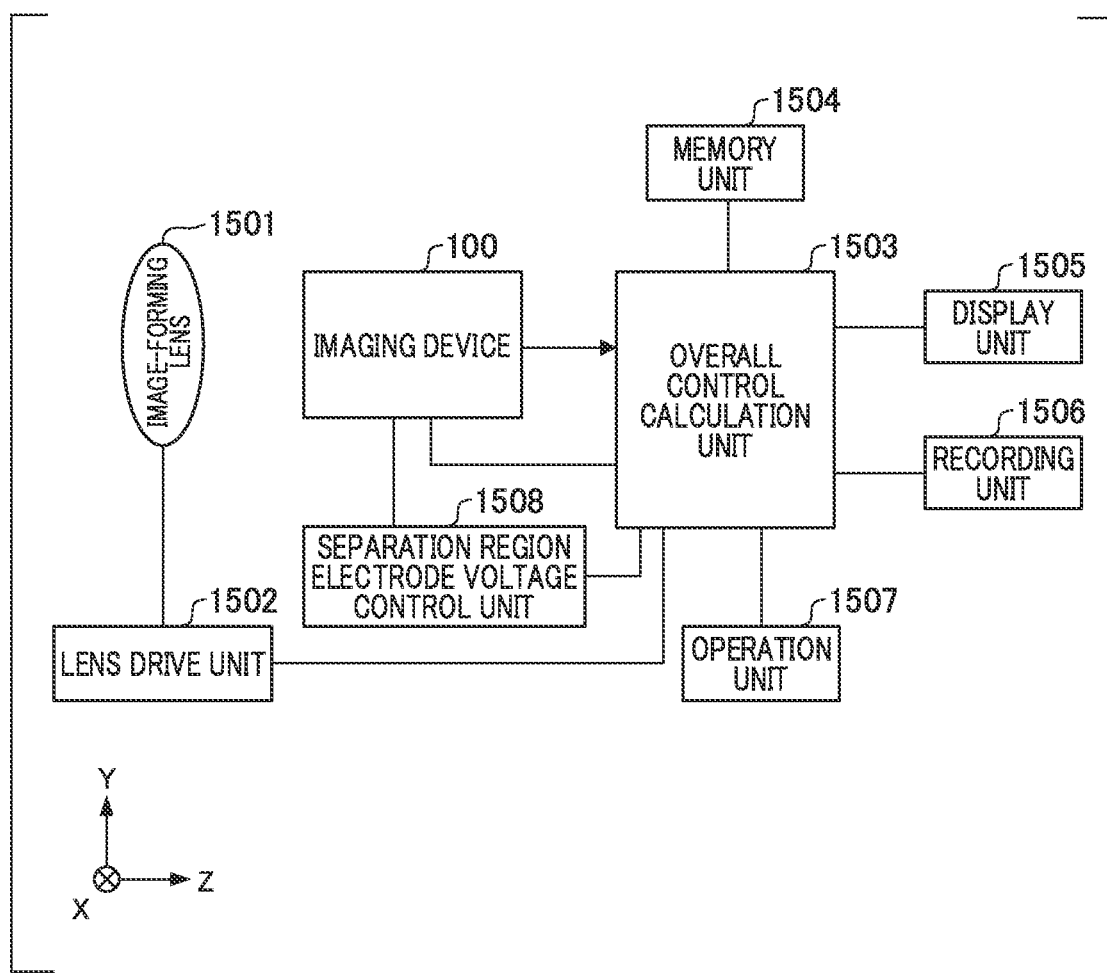
FIG. 12 is a schematic diagram illustrating an overall configuration of an imaging apparatus in a fifth embodiment.

The light receiving unit is formed of a silicon (Si) semiconductor. In addition, as illustrated in FIGS. 4 and 5, a surface in the light receiving unit on a side on which a z-coordinate value is large is a light receiving surface (a first surface). Furthermore, a configuration in which light of a subject image is incident from the light receiving surface side of the imaging device through an image-forming lens 1501 in FIG. 12 is provided. As illustrated in FIG. 4, a surface in the light receiving unit opposite to the light receiving surface is referred to as a "drive surface (a second surface)".

In FIGS. 4 and 5, the plurality of photoelectric conversion elements (the PDA 201 and the PDB 202) constituting the light receiving unit are composed of photodiodes (also referred to "PDs") in which complete charge transfer is possible. Although most of a PD of one pixel is a region in which photoelectrical conversion can be performed, the two photoelectric conversion elements (the PDA 201 and the PDB 202) and the separation region 303 are formed by forming a distribution of impurity concentration in a prescribed pattern inside the PD.

In the PDA 201 and the PDB 202, a depletion layer extends in the z direction in FIGS. 4 and 5 and a potential thereof has a low potential on a side on which a z-coordinate value is low. A minimum value of the potential is formed in the vicinity of the drive surface so that complete charge transfer is possible. An insulating layer 301 configured to minimize crosstalk with a neighboring pixel is formed at a pixel boundary portion. Furthermore, a wiring layer 504 formed of a metal wiring and an insulator is arranged in a region having a z-coordinate value smaller than that of the drive surface.

In a region between the PDA 201 and the PDB 202, the separation region 303 is provided on the light receiving surface side. Furthermore, in order to control a potential of the separation region 303, the separation region control electrode 304 is embedded to enter the light receiving unit in the z direction from the second surface side of the semiconductor substrate. As illustrated in FIGS. 6A and 6B, the separation region 303 is doped with impurities so that a potential of a center of the separation region 303 in the x direction is high and a potential of the separation region 303 in the y direction has a substantially constant distribution.

The separation region control electrode 304 is made of, for example, a polysilicon and a metal in contact with a semiconductor constituting the light receiving unit. Furthermore, a length of the separation region control electrode 304 in the z direction may differ for each color filter in accordance with a depth at which light of each color is absorbed in the light receiving unit made of Si. That is to say, when a color filter is provided for each pixel, a length of the light receiving unit of the separation region control electrode in a depth direction may differ for each color filter.

A p region having holes as a large number of carriers present therein in the vicinity of a region in contact with a metal/insulating layer in the light receiving unit made of Si and a dark current caused due to a Si interface is minimized. In the light receiving unit made of Si, a p region 305 is formed in the vicinity of a region in contact with the separation region control electrode 304 and a p region 302 is formed in the vicinity of a region in contact with the insulating layer 301.

Also, a p region 505 is formed in the vicinity of a Si interface in contact with the wiring layer 504 and a p region 506 is formed in the vicinity of a Si interface in contact with a light receiving surface-side insulating layer. Furthermore, the separation region 303, the separation region control electrode 304, and the p region 305 may be arranged at the pixel boundary portion instead of the insulating layer 301.

A microlens 501, a color filter 502, and a light-shielding wall 503 are formed on the light receiving surface side of each pixel portion from a side having a large z-coordinate value. When light parallel to a z axis is incident on a pixel, the microlens is formed so that the light is substantially focused on a center of gravity of a separation region on the light receiving surface.

As can be seen from FIGS. 6A and 6B, there is a potential barrier at a position of the separation region between the PDA 201 and the PDB 202. Furthermore, as illustrated in FIGS. 6A and 6B, a height of the potential barrier and a shape thereof in the x direction can be changed in accordance with a voltage value applied as a separation region control voltage.

The separation region control electrode is connected to a voltage control unit provided externally from a pixel wiring via a peripheral circuit and a voltage control unit can control a voltage of the separation region control electrode.

As illustrated in FIGS. 6A and 6B, when a voltage of the separation region control electrode 304 is relatively low, the potential of the separation region 303 via the p region 305 connected to the electrode is Va.

Also, if the voltage of the separation region control electrode 304 is relatively high, the potential of the separation region 303 via the p region 305 connected to the separation region control electrode 304 is Vb lower than Va.

During an accumulation period, light incident on the pixel 200G is focused using the microlens 501. Furthermore, the light is separated using the color filter 502 and then is incident on the separation region 303, the PDA 201, and the PDB 202.

In the separation region 303, the PDA 201, and the PDB 202, a pair of an electron and a hole (an electron hole) is generated in accordance with an amount of incident light and an angle of incidence and is separated using an electric field. Positively-charged holes are discharged through a p-type semiconductor region connected to a constant voltage source. Negatively-charged electrons move and accumulate as signal charges as follows.

When light is incident on a Si layer which is a light receiving unit (a photoelectric conversion element), the majority of the electrons generated through photoelectric conversion in the PDA 201 move toward a side in the PDA 201 having a relatively low potential and a relatively small z-coordinate value and are accumulated in the vicinity of the drive surface in which a potential is minimized. The majority of the electrons generated in the PDB 202 also move toward a side in the PDB 202 having a relatively low potential and a relatively small z-coordinate value and are accumulated in the vicinity of the drive surface in which a potential has a minimum value.

On the other hand, the electrons generated in the separation region 303 illustrated in FIG. 6 are distributed to the PDA 201 and the PDB 202 which are both sides of the potential barrier in the x direction. Furthermore, the electrons move toward a side on which a potential is relatively low (a z-coordinate value is relatively small) and are accumulated in the vicinity of the drive surface in which a potential is minimized. That is to say, the electrons other than the electrons loss in the separation region are accumulated in the PDA 201 or the PDB 202 and are output as photoelectric conversion signals in each of the PDA 201 and the PDB 202.

Here, the electrons which have undergone photoelectric conversion and have been accumulated near a potential minimum value of the PDA 201 or the PDB 202 in the z direction can move backward and forward between the PDA 201 or the PDB 202 and the potential barrier existing between the PDA 201 and the PDB 202 with a certain probability (ratio). In this specification, this is referred to as "charge crosstalk" and a ratio thereof is referred to as a "charge crosstalk rate". The charge crosstalk rate changes depending on the height and the width of the potential barrier between the PDA 201 and the PDB 202.

A correspondence between a pixel structure in this embodiment and pupil division will be described below with reference to FIGS. 7 and 8. FIG. 7 is a schematic diagram illustrating a relationship between a cross section structure of a pixel and the exit pupil surface of the imaging optical system in the first embodiment.

With regard to the exit pupil surface, an optical axis direction is defined as the z direction and the x direction and the y direction are shown on the paper surface of FIG. 7. FIG. 8 is a diagram for explaining a pupil intensity distribution and a change thereof in the first embodiment.

The light receiving surface of the pixel portion and a pupil region 1100 are substantially in a conjugate relationship due to the microlens. The pupil region 1100 includes a first pupil division region 1101, a second pupil division region 1102, and a third pupil division region 1103. A relationship in which the PDA 201 and the first pupil division region 1101 correspond to each other, the PDB 202 and the pupil division region 1102 correspond to each other, and the separation region 303 and the pupil division region 1103 correspond to each other is provided. That is to say, light of light from a subject transmitted through the first pupil division region 1101 is incident on the PDA 201 via the microlens 501.

Also, the light which has been transmitted through the second pupil division region 1102 and the light which has been transmitted through the third pupil division region 1103 are incident on the PDB 202 and the separation region 303, respectively, via the microlens 501.

Figure 8:
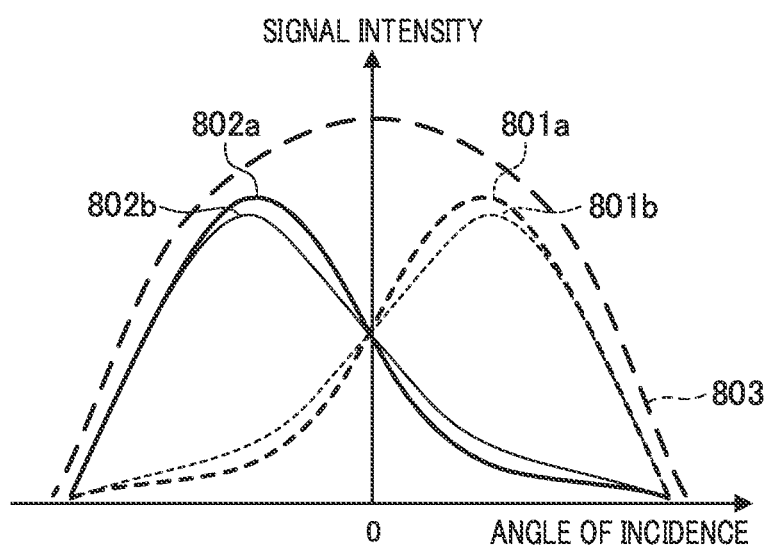
FIG. 8 is a diagram for explaining a pupil intensity distribution and change therein in the first embodiment.

FIG. 8 illustrates the light incidence angle dependence (a pupil intensity distribution) of a reception signal when light is incident on a pixel located at a center of the pixel array unit 101. A signal intensity obtained using the PDA 201 is denoted by reference symbol 801a (801b), a signal intensity obtained using the PDB 202 is denoted by reference symbol 802a (802b), and an imaging signal intensity obtained by adding the signal intensities obtained using the PDA 201 and the PDB 202 is denoted by reference symbol 803.

In FIG. 8, 801a and 802a indicate signal intensities (pupil intensity distributions) in a case in which a charge crosstalk rate between the PDA 201 and the PDB 202 is relatively low and 801b and 802b indicate signal intensities (pupil intensity distributions) in a case in which a charge crosstalk rate between the PDA 201 and the PDB 202 is relatively high.

Here, as illustrated in FIG. 2, a subject image signal acquired from each output of a group of PDAs 201 regularly arranged in an x (axis) direction is referred to as an "A image signal (A image data)". Furthermore, a subject image signal acquired from each output of a group of PDBs 202 regularly arranged in the x (axis) direction is referred to as a "B image signal (B image data)". In addition, a subject image created by adding the A image signal and the B image signal for each pixel is referred to as an "A+B image signal".

In FIG. 8, the signal intensity 801a (801b) obtained using the PDA 201 corresponds to the A image signal and the signal intensity 802a (802b) obtained using the PDB 202 corresponds to the B image signal. Furthermore, the imaging signal intensity 803 obtained by adding the signal intensities obtained using the PDA 201 and the PDB 202 corresponds to the A+B image signal.

It is possible to detect an amount of defocus (an amount of focus deviation) of a subject image having a luminance distribution in the x (axis) direction by detecting an amount of image deviation (a relative position) between the A image signal and the B image signal.

In the image deviation amount calculation, an amount of deviation with the smallest sum of squares (a reliability value) of differences between the A image signal and the B image signal for each pixel when the relative position between the A image signal and the B image signal deviates is defined as an image deviation position. Furthermore, this reliability value indicates that, when the value decreases, the accuracy of the image deviation amount calculation increases.

As for the pupil division characteristics for the focus detection of the pupil division phase difference method, when the charge crosstalk rate decreases, a baseline length which is an intensity difference in the center of gravity between an output signal of the PDA 201 and an output signal of the PDB 202 is easily secured and the accuracy is easily obtained. However, when the charge crosstalk rate increases, the reliability may increase in a case in which the angle of incidence increases in many cases. In this way, the pupil division characteristics change due to the change in the charge crosstalk rate and thus the focus detection performance changes.

Also, if a thickness of the Si layer of the light receiving unit (the photoelectric conversion element) changes, a region thickness which contributes to photoelectric conversion changes and the charge crosstalk rate changes. Such film thickness variations occur due to producing errors in the producing process of the imaging device and the charge crosstalk rate, that is, the pupil division performance varies from individual to individual.

In the imaging device in this embodiment, the charge crosstalk rate between the PDA 201 and the PDB 202 in the imaging pixel can be adjusted (corrected) by changing a height of the potential barrier by applying a voltage to the separation region control electrode.

In this embodiment, for example, the imaging device having a pupil intensity distribution close to a design value without applying a voltage to the separation region control electrode is assumed as a standard sample. Furthermore, with regard to a sample with a Si film thickness thicker than that of a standard sample and a sample with a Si film thickness thinner than that of the standard sample, it is possible to correct the performance of a sample whose structure varies from the standard sample by extracting a separation region control electrode voltage used for matching a pupil intensity distribution and that of the standard sample.

For this performance correction, the pupil intensity distributions of the PDA 201 and the PDB 202 may be measured for each imaging device, deviation from the standard sample may be detected, and a correction voltage may be applied to the separation region control electrode to correct this. In the imaging device in this embodiment, the variation in pupil division performance includes not only the variation in the film thickness of the light receiving unit made of Si described above but also the deviation from other structures as a factor. Thus, it is possible to make corrections not only according to the film thickness of Si but also according to other structural portions.

That is to say, in this embodiment, the variations in the pupil intensity distributions of the PDA 201 and the PDB 202 caused by the variation in the film thickness of the light receiving unit and other producing errors can be corrected by adjusting the voltage value applied to the separation region control electrode. Thus, it is possible to improve the phase difference detection accuracy.

Second Embodiment

Figure 9:
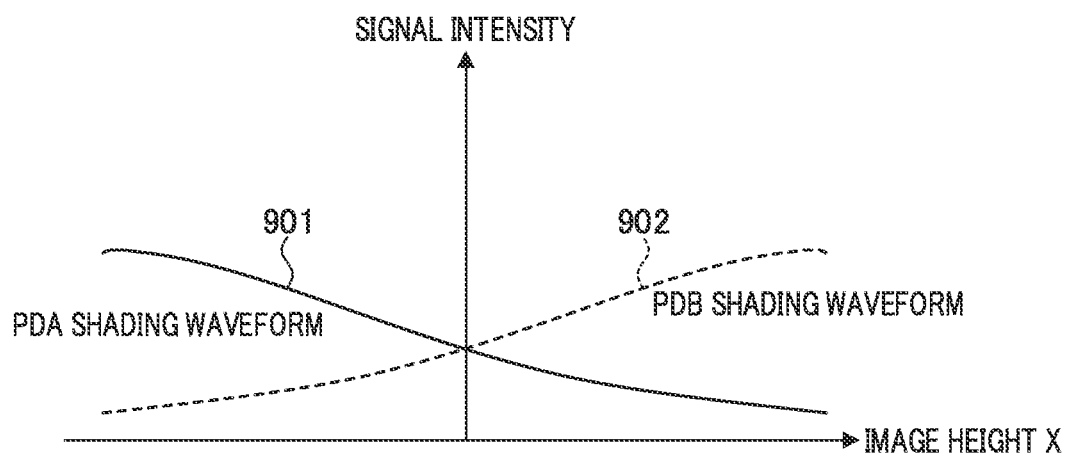
FIG. 9 is a diagram illustrating a shading waveform in a second embodiment.

In the imaging device in this embodiment, the correction of the performance variation due to the individual structure variation of the imaging device in the first embodiment is performed with reference to the deviations of shading waveforms of the image signal obtained from the group of PDAs 201 and the image signal obtained from the group of PDBs 202 from the standard sample. FIG. 9 is a diagram illustrating a shading waveform in the second embodiment.

For example, a shading waveform of the image signal obtained from the group of PDAs 201 and the image signal obtained from the group of PDBs 202 when a screen with uniform brightness is captured, in which the image signal from the pixel array on an alternate long and short dash line W-W' in FIG. 1 is graphed in the x direction, is shown.

In FIG. 9, a shading waveform based on the image signal obtained from the group of PDAs 201 is denoted by reference numeral 901 and a shading waveform based on the image signal obtained from the group of PDBs 202 is denoted by reference numeral 902. As illustrated in FIG. 9, the waveforms of reference numerals 901 and 902 change substantially symmetrically in accordance with an image height (a distance from a center (an optical axis) on the light receiving surface). However, the waveform may be asymmetric due to producing errors or the like or the shading waveform may be distorted in some cases.

Here, the pupil division characteristics when the focus detection of the pupil division phase difference method is performed correlate with the shading characteristics of these signals obtained from the photoelectric conversion elements. The distortion and the asymmetry of the shading characteristics which cause deterioration of such pupil division characteristics also depend on the charge crosstalk rate in the pixel. Therefore, in the imaging pixel in this embodiment, it is possible to modify (correct) the pupil division characteristics by controlling the voltage applied to the separation region control electrode.

As in the first embodiment, it is possible to control individual variation and distortion using an application voltage by measuring a relationship between the deviation of the shading waveform and the application voltage with respect to the standard sample in advance for each imaging device in the producing process and storing the measured relationship in the memory.

Unlike the pupil intensity distribution measurement, since the shading waveform can be acquired with only one or several imaging procedures, there is an advantage that the efficiency of correction is high.

Third Embodiment

Figure 10:
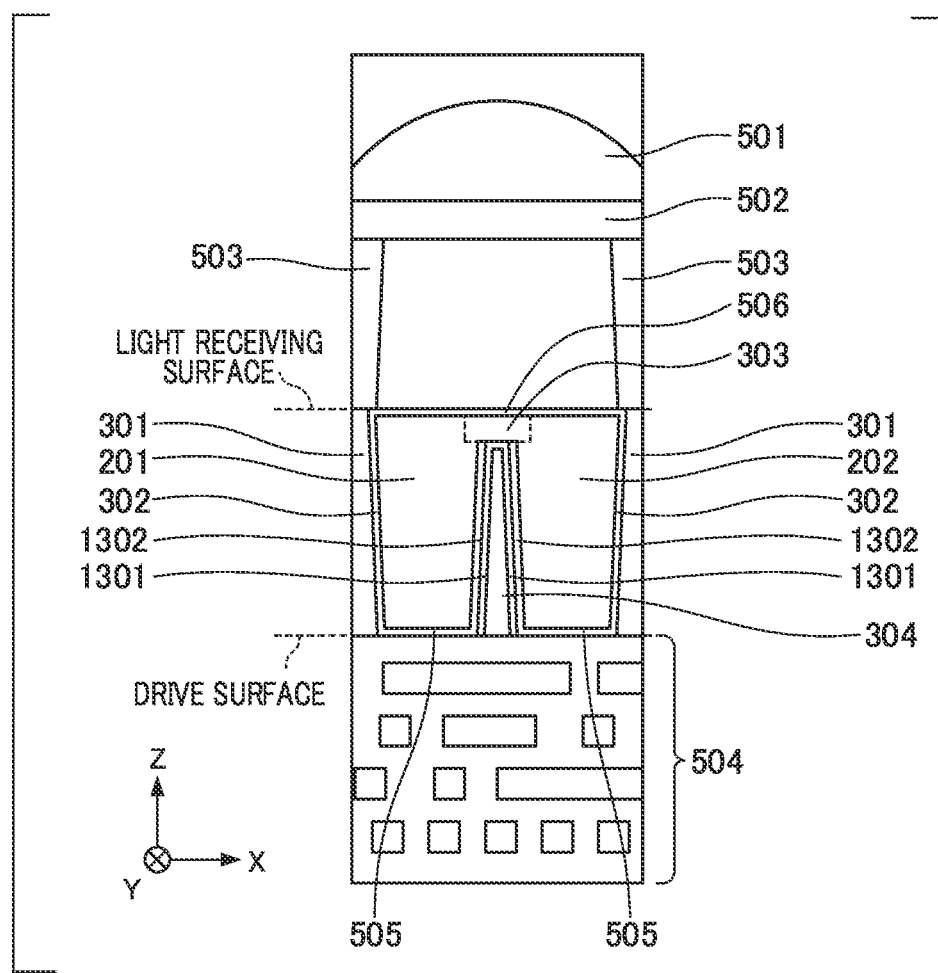
FIG. 10 is a schematic diagram illustrating a cross section of a pixel in a third embodiment.

FIG. 10 is a schematic diagram illustrating a cross section of a pixel of an imaging device in a third embodiment. In the third embodiment, only the structures of the separation region control electrodes of the pixels in the first and second embodiments are changed.

In the third embodiment, an insulating film 1301 is formed around the separation region control electrode 304. Furthermore, in the light receiving unit made of Si, a p region 1302 having holes present as a large number of carriers is formed in the vicinity of a side surface region in contact with the insulating film 1301 in the x direction or the y direction.

On the other hand, the p region 1302 is not formed in the vicinity of an upper surface region in contact with the insulating film 1301 in the z direction. The separation region control electrode 304 is made of, for example, a polysilicon and a metal and the insulating film 1301 is made of, for example, silicon oxide or silicon nitride. In this way, in the third embodiment, an insulating film is provided between the separation region control electrode and a part of the semiconductor region constituting the light receiving unit.

An electric field from the separation region control electrode 304 is terminated through holes which are multiple carries when a p region is formed. For this reason, it is possible to minimize an influence of a voltage change of the separation region control electrode 304 on the depletion layer forming the PDA 201 and the PDB 202. On the other hand, since a p region is not formed between the insulating film 1302 and the separation region 303, an electric field from the separation region control electrode 304 can change a potential of the depletion layer.

Fourth Embodiment

Figure 11:
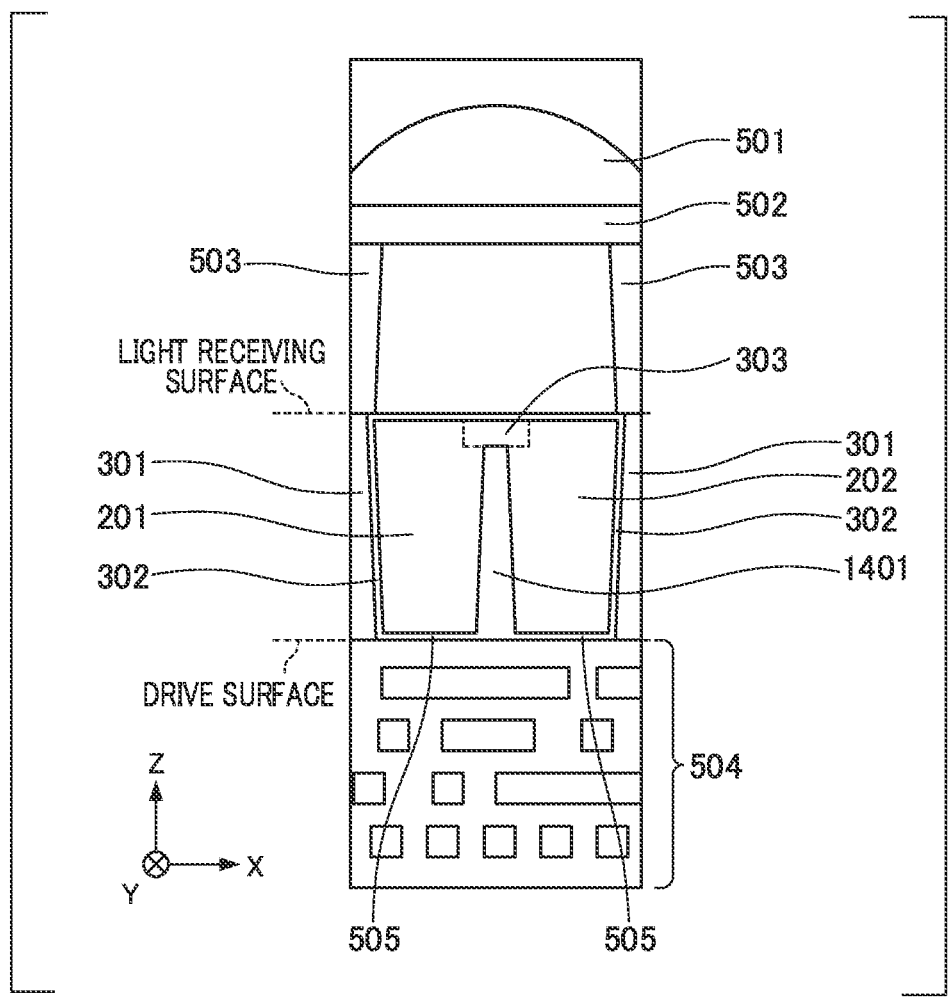
FIG. 11 is a schematic diagram illustrating a cross section of a pixel in a fourth embodiment.

FIG. 11 is a schematic diagram illustrating a cross section of a pixel in a fourth embodiment. In the fourth embodiment, only the structures of the separation region control electrodes of the pixels in the first to third embodiments are changed.

In the fourth embodiment, the separation region control electrode 1401 is constituted of a p layer from the drive surface side to the separation region 303. That is to say, a p layer is formed to extend from the drive surface side to the separation region 303 by performing ion implantation multiple times by changing implantation energy and the separation region control electrode 1401 is constituted of this p layer.

That is to say, the light receiving unit is composed of, for example, an n-type semiconductor and the separation region control electrode is composed of a p-type semiconductor having a conductive type different from that of the photoelectric conversion element.

Since the separation region control electrode 1401 in the fourth embodiment has fewer Si interfaces as compared with the first to third embodiments, it is possible to minimize dark current.

In this way, in the imaging device in the fourth embodiment, it is possible to control the potential of the separation region while minimizing the dark current caused due to the Si interface and it is possible to acquire an imaging signal in which unnatural burring is minimized and selectively acquire a signal suitable for focus detection.

Fifth Embodiment

An example of a configuration of an imaging apparatus in a fifth embodiment will be described with reference to FIG. 12 as the fifth embodiment.

FIG. 12 is a schematic diagram illustrating an overall configuration of an imaging apparatus in the fifth embodiment and illustrates an example of a configuration of an imaging apparatus (for example, a digital still camera) including the imaging device 100 in the first to fourth embodiments installed therein.

The image-forming lens 1501 forms an optical image of a subject incident from a −z direction in FIG. 12 on the light receiving surface of the imaging device 100. A lens drive unit 1502 performs zoom control, focus control, diaphragm control, and the like of the image-forming lens 1501.

An overall control calculation unit 1503 performs correction of the signal output from the imaging device 100, generation of an image, calculation of an amount of defocus, generation of a lens drive signal, focus detection of a pupil division phase difference method using the signal photoelectrically converted by the two photoelectric conversion elements, and the like. That is to say, the overall control calculation unit 1503 also functions as a focus detection unit.

Here, as described above, the focus detection of the pupil division phase difference method is a process of performing focus detection by detecting the amount of image deviation (relative position) between the A image signal and the B image signal to detect an amount of defocus (an amount of focus deviation) of a subject image having a luminance distribution in the x (axis) direction.

In the calculation of the amount of image deviation, the amount of deviation having the smallest sum of squares (reliability value) of the difference between the A image signal and the B image signal for each pixel when the relative position between the A image signal and the B image signal deviates is defined as the amount of image deviation.

A memory unit 1504 functions as a memory for temporarily storing image data. An image display unit composed of, for example, an LCD and the like is denoted by reference numeral 1505.

A recording unit 1506 is, for example, an attachable/detachable semiconductor memory configured to perform recording and reading image data. An operation unit 1507 corresponds to various interfaces of an imaging system and the overall control calculation unit 1503 controls each configuration of the imaging system in accordance with an instruction from a user via the operation unit 1507.

The overall control calculation unit 1503 includes a CPU as a computer built therein and functions as a control means for executing various operations of the entire device on the basis of a computer program stored in a memory (not shown).

The operation unit 1507 is composed of a power switch, a shutter switch, a zoom operation switch, a photographing mode selection switch, a touch panel of the display unit 1505, and the like. The shutter switch includes an imaging instruction switch SW2 which is turned on when a shutter button is fully pressed and causes capturing to start.

At the time of photographing, a separation region electrode voltage control unit 1508 applies an application voltage for correcting the individual variation of the amount of charge crosstalk of the imaging device caused using the producing process obtained through the method described the above-described embodiment to the separation region electrode in the pixel of the imaging device. Thus, it is possible to control the height of the potential barrier in the separation region in the pixel of the imaging device, correct the amount of charge crosstalk, and improve the pupil division characteristics.

That is to say, although the pupil division characteristics in the focus detection deteriorate due to the asymmetry, distortion, and the like of the A image signal and the B image signal, it is possible to improve the pupil division characteristics by performing correction by adjusting the voltage applied to the separation region electrode of each pixel.

In the correction data associated with the application voltage, a voltage applied to the separation region electrode for each pixel is controlled by storing data measured in the producing process for each imaging device in, for example, the memory unit 1504 and reading the correction data from the memory at the time of photographing.

As described above, as the pupil division characteristics for the focus detection of the pupil division phase difference method, when the charge crosstalk rate decreases, the baseline length which is the intensity difference in the center of gravity between the output signal of the PDA 201 and the output signal of the PDB 202 is easily secured and the accuracy is easily obtained. However, when the charge crosstalk rate increases, it is possible to increase the reliability in a case in which the angle of incidence increases.

In this way, the pupil division characteristics change due to the change in the charge crosstalk rate and thus the focus detection performance changes.

Sixth Embodiment

In a sixth embodiment, an image-forming lens 1501 is provided in a lens barrel attachable to and detachable from a camera main body (an imaging apparatus main body). Furthermore, exit pupil information of an imaging lens is stored in advance in a memory in a lens barrel. In addition, sensor pupil distance information of the image-forming device is stored in the memory inside the imaging apparatus main body.

Also, when the lens barrel is installed in the camera main body, the exit pupil information of the image-forming lens stored in the memory in the lens barrel is read out in the imaging apparatus main body. Furthermore, a difference between the sensor pupil distance of the imaging device and the exit pupil distance of the image-forming lens is calculated and a voltage to the separation region electrode is controlled in accordance with the difference. Thus, the accuracy of phase difference detection is improved.

That is to say, a voltage control unit improves the pupil division characteristics by changing the voltage applied to a separation region control electrode in accordance with an imaging optical system configured to form an optical image on a light receiving unit.

Figure 13:
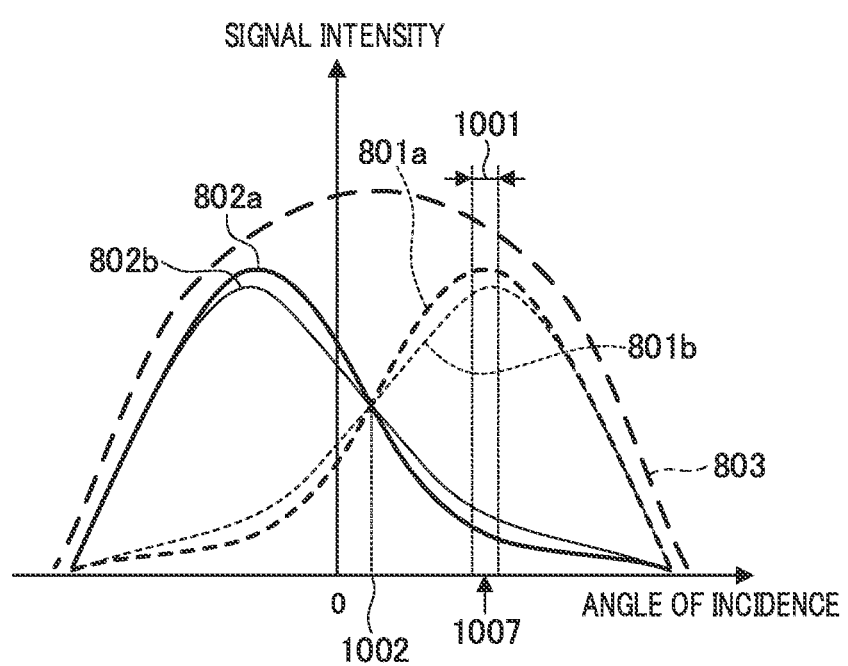
FIG. 13 is a diagram for explaining a pupil intensity distribution in a sixth embodiment.
Figure 14:
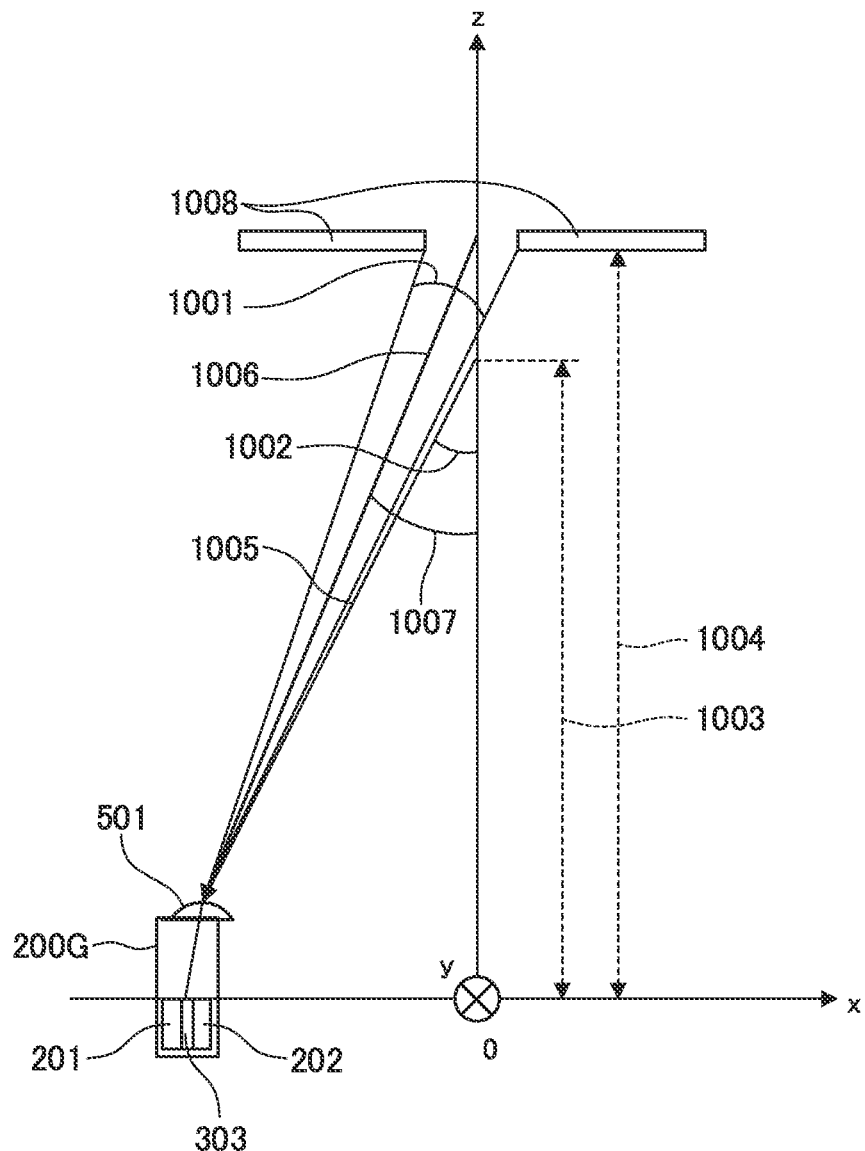
FIG. 14 is a diagram illustrating a relationship between a sensor pupil distance and a lens exit pupil distance in the sixth embodiment.

FIG. 13 is a diagram for explaining a pupil intensity distribution in the sixth embodiment and illustrates a pupil intensity distribution of a pixel at a prescribed line position in an effective pixel range (a pixel range displayed by a display unit) of an imaging device 100. FIG. 14 is a diagram illustrating a relationship between a sensor pupil distance and a lens exit pupil distance in the sixth embodiment.

In the imaging device 100 in the sixth embodiment, as illustrated in FIG. 14, a position of the microlens 501 of each pixel is gradually eccentric from a center of the pixel toward a center of the imaging device as it goes from a center of the light receiving surface (a position of an angle of incidence 0) of the imaging device toward the periphery. This is to secure an amount of light to be received as much as possible.

However, in the pixel 200G at a peripheral position illustrated in FIG. 14, an angle of incidence of light having the same signal intensities in the PDA 201 and the PDB 202 is, for example, 1002 due to an influence of the microlens being eccentric from the center of the pixel.

In the pixel located at the center of the light receiving surface, the microlens 501 is not eccentric and the angle of incidence is zero. Therefore, the light received by the PDA 201 and the PDB 202 is equal and the signal intensities are substantially the same.

The angle of incidence 1002 is referred to as a "sensor pupil angle" or a surface perpendicular to the z axis of a position in which a line 1005 representing an incident direction intersects a line representing the sensor pupil angle of a central pixel (here, the z axis) is referred to as a "sensor pupil surface". A distance between the sensor pupil surface and the light receiving surface (here an xy surface) of the imaging device 100 is referred to as a "sensor pupil distance 1003".

On the other hand, when an optical diaphragm of an image-forming lens to be installed is denoted by reference numeral 1008, a line 1006 connecting a center of the diaphragm aperture to the pixel 200G represents an incident light axis and light having an angle width 1001 is incident on the pixel 200G through the diaphragm aperture.

In the pupil intensity distribution of FIG. 13, the signal intensities (pupil intensity distributions) of the PDA 201 and the PDB 202 when the voltage applied to the separation region electrode is zero are denoted by reference symbols 801a and 802a. The incident light indicated by the angle width 1001 in FIG. 14 corresponds to the angle width 1001 illustrated in FIG. 13. The light limited due to this angle width is received by the PDA 201 and the PDB 202 and it is necessary to detect a phase difference between waveforms of the A image signal and the B image signal obtained as a result of the photoelectric conversion.

When the voltage applied to the separation region electrode is zero, in the angle width 1001 to be cut, a peak of a PDA waveform 801 is exceeded on a plus side and a position of a center of gravity approaches a minus side within the angle width 1001. Therefore, the difference in the center of gravity from the PDB waveform, of which the position of the center of gravity is on the minus side within the angle width 1001 decreases (or the direction is opposite to that in a case in which a deviation between the sensor pupil distance 1003 and the lens exit pupil distance 1004 is small) and it is difficult to detect the phase difference in some cases.

This situation can occur when a deviation between the angle of incidence (the sensor pupil angle) 1002 and an exit pupil angle 1007 of the image-forming lens, that is, a deviation between the sensor pupil distance 1003 and the lens exit pupil distance 1004 is large.

That is to say, when the deviation between the sensor pupil distance 1003 and the lens exit pupil distance 1004 increases, an angle difference between the angles 1002 and 1007 in FIG. 13 increases and an intensity difference between the PDA waveform (the A image signal) and the PDB waveform (the B image signal) increases. Moreover, when the diaphragm is stopped down, a width of the width 1001 narrows of FIG. 13. Thus, it is more difficult to perform phase difference detection.

Thus, in the sixth embodiment, when the image-forming lens 1501 is installed, the lens exit pupil distance 1004 stored in the memory in the lens barrel in advance as a part of the lens information is received by the imaging apparatus main body side. Furthermore, a difference between the sensor pupil distance 1003 stored in advance in the memory of the imaging apparatus main body and the lens exit pupil distance 1004 is calculated. In the memory inside the imaging apparatus main body, an amount of correction (an application voltage table) of a charge crosstalk rate according to the difference between the lens exit pupil distance 1004 and the sensor pupil distance 1003 is stored in advance.

The details of the application voltage table include, for example, a table in which, when the difference between the lens exit pupil distance 1004 and the sensor pupil distance 1003 increases, crosstalk is increased by increasing a voltage applied to the separation region electrode. Furthermore, a voltage to be applied is applied to the separation region electrode via a separation region electrode voltage applying means with reference to the application voltage table obtained from the memory. Thus, it is possible to correct an intensity difference between the PDA waveform and the PDB waveform due to the deviation between the sensor pupil distance 1003 and the lens exit pupil distance 1004.

Although the pupil division characteristics (the pupil intensity distribution characteristics on the photoelectric conversion element) change in accordance with the relationship between the exit pupil distance of the imaging optical system configured to form an optical image on the light receiving unit and the sensor pupil distance of the imaging device, according to this embodiment, it is possible to improve such pupil division characteristics.

On the other hand, when a difference between the lens exit pupil distance 1004 and the sensor pupil distance 1003 is small, a voltage applied to the separation region electrode is reduced (or set to zero) so that the baseline lengths of the PDA waveform (the A image signal) and the PDB waveform (the B image signal) are lengthened to improve the distance measurement accuracy.

Here, since the difference between the exit pupil distance and the sensor pupil distance increases in accordance with the distance from the center of the light receiving unit, the voltage control unit causes the voltage applied to the separation region control electrode to change in accordance with the distance from the center of the light receiving unit.

In this way, when the difference between the exit pupil distance and the sensor pupil distance is large, the signal intensities 801a and 802a of the PDA 201 and the PDB 202 are corrected to 801b and 802b by applying a voltage higher than that when the difference is small to the separation region electrode.

That is to say, a voltage in which the potential barrier of the separation region is reduced is applied and thus the intensity difference between the PDA waveform and the PDB waveform is reduced in an angle width 1011 and thus the reliability of the phase difference detection is improved.

In this way, in the first to sixth embodiments, it is possible to improve the pupil division characteristics for the focus detection of the pupil division phase difference method by minimizing individual variation of the imaging device in an imaging device and an imaging apparatus including the imaging device utilized therein or correcting an optical performance deviation from an interchangeable lens.

Seventh Embodiment

Figure 15:
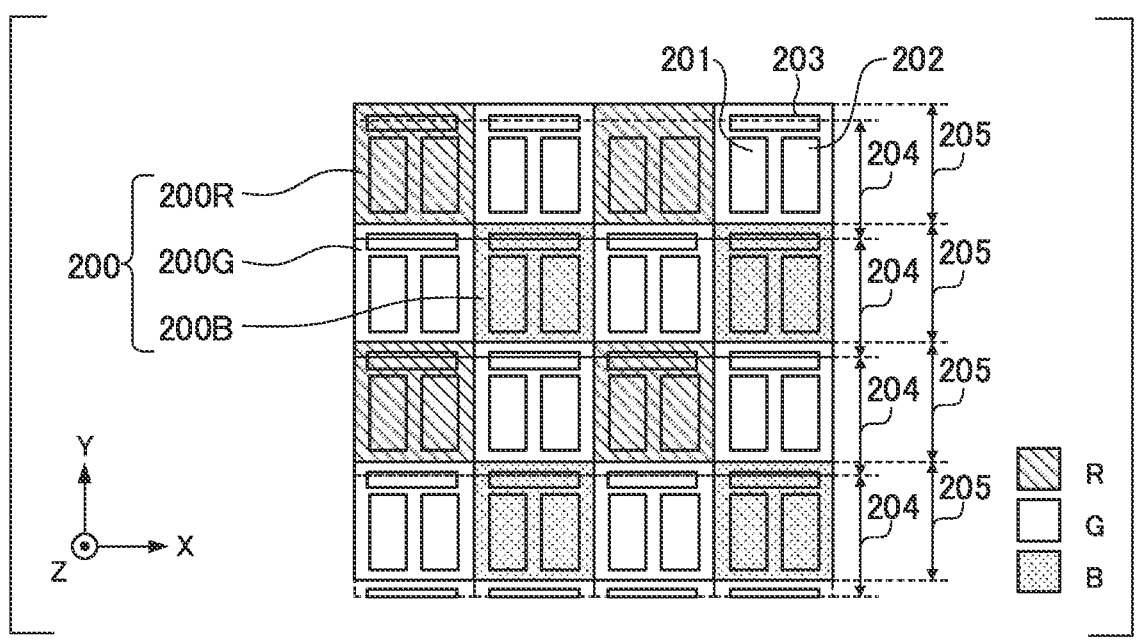
FIG. 15 is a schematic diagram illustrating a pixel arrangement of a pixel array in a seventh embodiment.

FIG. 15 is a schematic diagram illustrating a pixel arrangement of a pixel array in a seventh embodiment. In addition, a configuration in FIG. 15 and the configuration in the first embodiment illustrated in FIG. 2 differ in that a light receiving unit of each pixel in the configuration in FIG. 15 is composed of three photoelectric conversion elements.

The three photoelectric conversion elements constituting the light receiving unit of each of the pixels are each composed of a photodiode (PD) in which complete charge transfer is possible. In one pixel portion, a PDC 203 as a PD is arranged on a side with a relatively large y-coordinate value with respect to the PDA 201 arranged on a side with a relatively small x-coordinate value and the PDB 202 arranged on a side with a relatively large x-coordinate value.

The PDA 201 and the PDB 202 are used for accumulation and the PDC 203 is used as an emission path (a drain region) for discharging electric charges of the separation region 303.

Figure 16A:
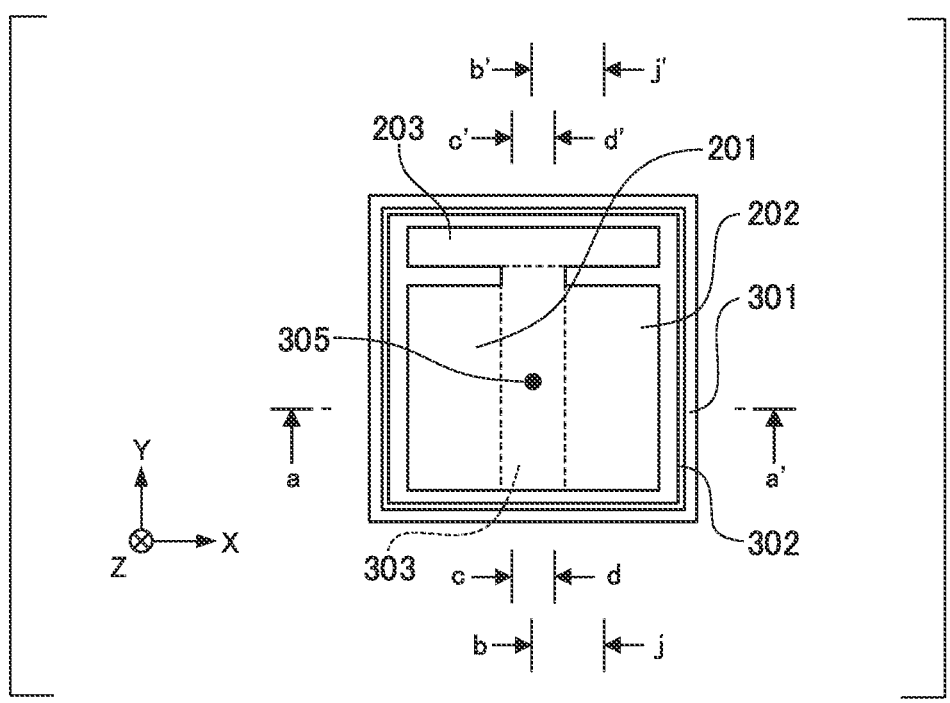
FIGS. 16A and 16B are diagrams of a pixel in the seventh embodiment when viewed from a light receiving surface side (+z side).
Figure 16B:
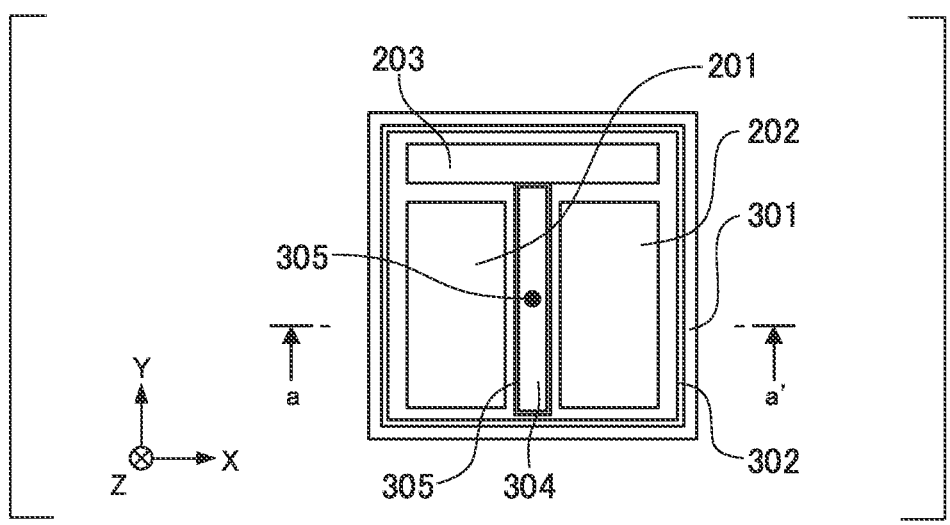

FIGS. 16A and 16B are diagrams of the pixel 200G in the seventh embodiment when viewed from the light receiving surface side (+z side) of the imaging device 100. Since a cross section structure of an a-a' cross section of the pixel illustrated in FIGS. 16A and 16B when viewed from the −y side has the same structure as that illustrated in FIG. 4 in the first embodiment, the seventh embodiment will be also described with reference to FIG. 4. FIG. 16A corresponds to the e-e' cross-sectional view in FIG. 4 and FIG. 16B corresponds to the f-f' cross-sectional view in FIG. 4.

Figure 19A:
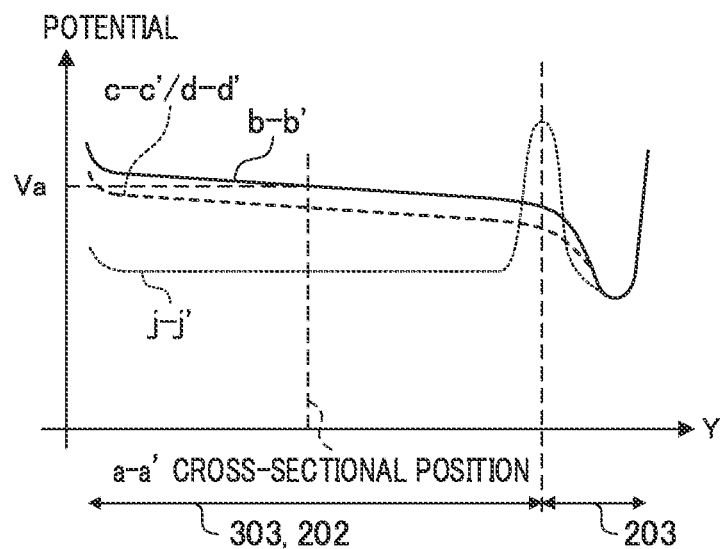
FIGS. 19A and 19B are schematic diagrams illustrating potential distributions of a light receiving unit in b-b', c-c', and d-d' line segments in FIGS. 16A and 16B in the seventh embodiment.
Figure 19B:
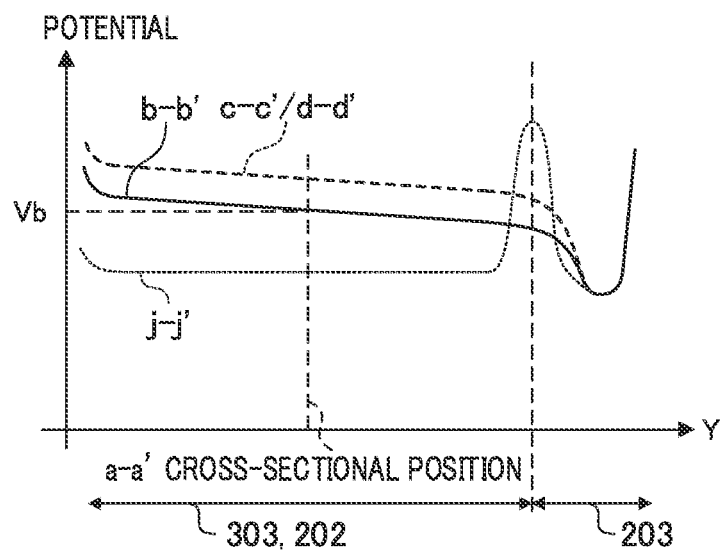

In the seventh embodiment, the separation region 303 is doped with impurities so that the potential of the separation region 303 has a distribution in which a potential of a center portion of the separation region 303 in the x direction is high and a potential of a side of the separation region 303 close to the PDC 203 in the y direction is low (refer to FIGS. 19A and 19B).

Also, a configuration in which the light incident on the PDC 203 which is a PD for discharging is less than the light incident on the PDA 201 and the PDB 202, regardless of the angle of incidence of light incident on the pixel is provided.

Figure 17A:
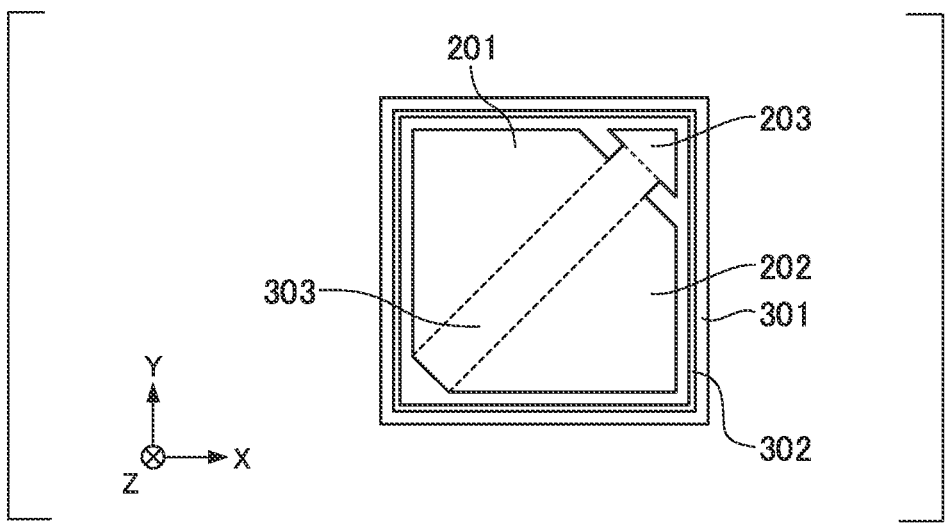
FIGS. 17A and 17B are diagrams of another example of the pixel in the seventh embodiment when viewed from the light receiving surface side (+z side).
Figure 17B:
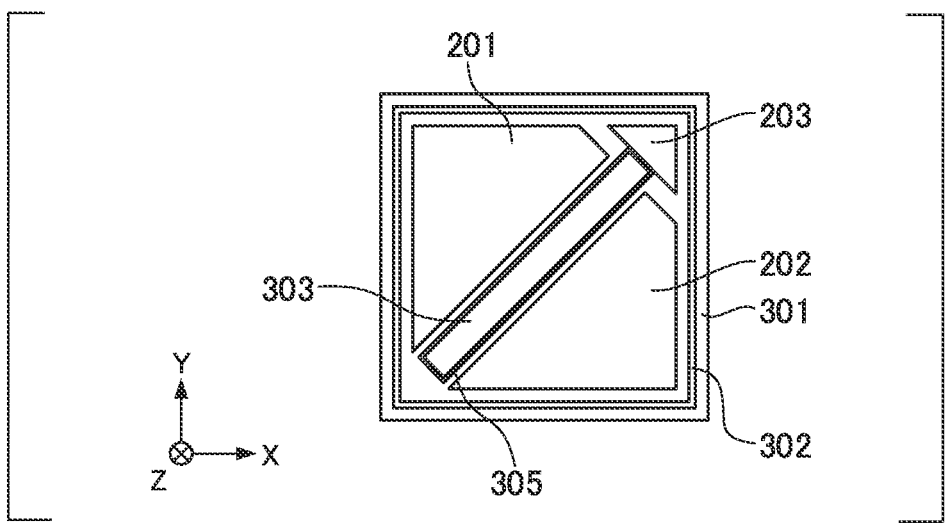

FIGS. 17A and 17B are diagrams illustrating another example of the pixel in the seventh embodiment when viewed the light receiving surface side (+z side). In addition, as illustrated in FIGS. 17A and 17B, in order to reduce an amount of light to be incident on the PDC 203, the PDC 203 may be arranged on a corner side in the pixel having a rectangular shape. Furthermore, the separation region 303 may be arranged diagonally as illustrated in FIGS. 17A and 17B.

Also, the position of the PDC 203 as a drain region in each pixel may be differently (for example, point-symmetrically) arranged with respect to a center of the light receiving unit, wherein the center is a point at which the optical axis of the imaging optical system configured to form an optical image on the light receiving unit intersects the light receiving unit.

Figure 18A:
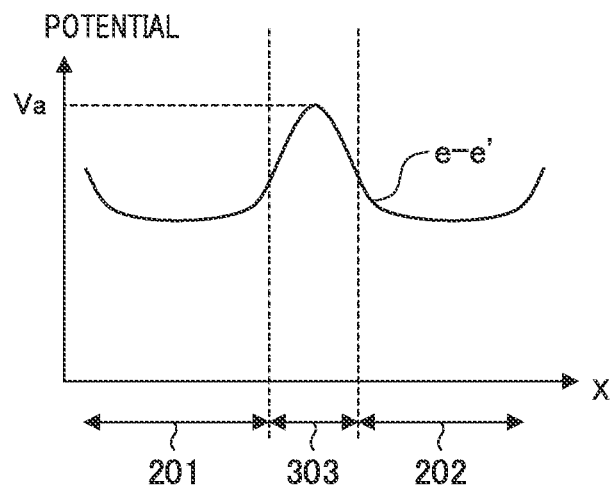
FIGS. 18A and 18B are schematic diagrams illustrating a potential distribution of a light receiving unit in an e-e' line segment in FIG. 4 in the seventh embodiment.
Figure 18B:
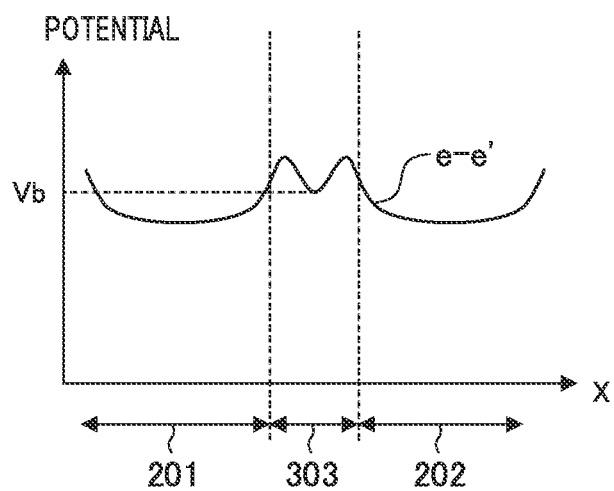

FIGS. 18A and 18B are schematic diagrams illustrating a potential distribution in the x direction shown the e-e' portion in FIG. 4 in the seventh embodiment. FIG. 18A illustrates an example a potential distribution when the voltage of the separation region control electrode 304 is relatively low and FIG. 18B illustrates an example of a potential distribution when the voltage of the separation region control electrode 304 is relatively high.

FIGS. 19A and 19B are schematic diagrams illustrating potential distributions of line segments in the y direction indicated by b-b', c-c', d-d', and j-j' in FIGS. 16A and 16B. FIG. 19A illustrates an example of a potential distribution when the voltage of the separation region control electrode 304 is relatively low and FIG. 19B illustrates an example of a potential distribution when the voltage of the separation region control electrode 304 is relatively high.

As indicated by j-j' in FIGS. 19A and 19B, there is a potential barrier between the PDB 202 and the PDC 203. similarly, there is a potential barrier between the PDA 201 and the PDC 203. On the other hand, there is no potential barrier between the separation region 303 and the PDC 203. In addition, as described above, the separation region 303 is doped with impurities so that a distribution in which a potential on a side of the separation region 303 close to the PDC 203 is low in the y direction of the separation region 303 is provided.

In this embodiment, as will be described below, the potential of the separation region is changed by changing the voltage applied to the separation region control electrode 304 and switching is performed between the collection and the discharging of the electric charges generated in the separation region during an accumulation period.

Since the cross section structure of the a-a' cross section of the pixel illustrated in FIGS. 16A and 16B when viewed from the −y side is the same as the structure illustrated in FIG. 4 in the first embodiment, the seventh embodiment will be also described with reference to FIG. 4.

The potential distribution of the light receiving unit in the seventh embodiment is the same as that in FIG. 5. In addition, as in the first embodiment, the potential distribution in the light receiving unit among the g-g', h-h', and i-i' line segments in FIG. 4 is schematically illustrated.

As in the first embodiment, the potential distribution 601 indicates a case in which the voltage of the separation region control electrode 304 is relatively low and the potential distribution 602 indicates a case in which the voltage of the separation region control electrode 304 is relatively high.

That is to say, in the seventh embodiment, as illustrated in FIG. 5, if the voltage of the separation region control electrode 304 increases, the potential of the p region 305 connected to the electrode decreases. Accordingly, the potential at an a-a' cross-sectional position changes from Va to Vb so that the potential of the separation region 303 which is a depletion layer is pulled by the p region 305.

At this time, in the seventh embodiment, as illustrated in FIG. 18B, the above-described potential change significantly occurs in the vicinity of a center of a potential peak in the x direction. Thus, a valley can be formed in a central portion of the potential peak of the separation region 303.

The light incident on the pixel 200G is focused using the microlens 501 during an accumulation period. Furthermore, the light is separated using the color filter 502 and then incident on the separation region 303, the PDA 201, the PDB 202, and the like. In the separation region 303, the PDA 201, the PDB 202, and the PDC 203, a pair of electron and hole (an electron hole) is generated in accordance with the amount of incident light and the angle of incidence and is separated using an electric field. Positively-charged holes are discharged through a p-type semiconductor region connected to a constant voltage source. Negatively-charged electrons are transported and accumulated as signal charges as follows.

<Accumulation Operation>

In this embodiment, an electron transport path is changed by changing the voltage applied to the separation region control electrode 304 during an accumulation period. That is to say, the potential of Si in the vicinity of a light incident surface which has a large number of electrons generated through photoelectric conversion is changed using the voltage applied to the separation region control electrode 304 arranged on the drive surface side opposite to the light incident surface. For this reason, the characteristics that the light incident on Si is not blocked and the light receiving sensitivity does not depend on the angle of incidence are provided.

In the seventh embodiment, a transport and accumulation operation in which the voltage applied to the separation region control electrode 304 is relatively low is referred to as a "separation region collection mode" and a transport and accumulation operation in which the voltage applied to the separation region control electrode 304 is relatively high is referred to as a "separation region discharge mode".

<<Separation Region Discharge Mode>>

The majority of the electrons generated in the PDA 201 are transported to a side in the PDA 201 in which the z-coordinate value with a relative low potential is relatively small (the left side in FIG. 5) and accumulated in the vicinity of the drive surface in which the potential is minimized. The majority of the electrons generated in the PDB 202 are transported to a side in the PDB 202 in which the z-coordinate value with a relative low potential is relatively small (the left side in FIG. 5) and accumulated in the vicinity of the drive surface in which the potential has a minimum value.

On the other hand, in the separation region discharge mode, as illustrated in FIG. 18B, the potential of the center of the separation region forms two peaks and a valley (a minimum value) between the two peaks in the x axis direction. Furthermore, the valley forms a groove-like potential toward the PDC 203 in the y direction. In addition, the separation region 303 has a potential decreasing toward the PDC 203 in the y axis direction as illustrated in FIG. 19B. Thus, the electrons generated in the separation region 303 are transported toward the PDC 203 along the above-described groove in a direction in which the y-coordinate value is high.

That is to say, the majority of the electrons generated in the separation region are collected in the valley in the x direction without being distributed to the PDA 201 and the PDB 202, are transported along the groove in the direction in which the y-coordinate value is high in the y direction in FIG. 19B, and reach the PDC 203. The electrons which have reached the PDC 203 are transported to a side having a low potential in the PDC 203 and discharged. That is to say, the electrons generated in the separation region are discharged without being accumulated. In the seventh embodiment, this accumulation operation is referred to as a "separation region discharge mode".

<<Separation Region Collection Mode>>

The majority of the electrons generated in the PDA 201 are accumulated in the vicinity of the drive surface in which the potential is minimized in the PDA 201. In addition, the majority of the electrons generated in the PDB 202 are also accumulated in the vicinity of the drive surface in which the potential has a minimum value in the PDB 202.

On the other hand, in the electrons generated in the separation region 303, in the separation region collection mode, the voltage applied to the separation region control electrode 304 relatively decreases.

Therefore, as illustrated in FIG. 18A, a peak (a maximum value) is formed in the center of the separation region in the x axis direction and a valley is not formed. Thus, the majority of the electrons generated in the separation region are distributed to ether the PDA 201 or the PDB 202. The distributed electrons are accumulated in the vicinity of the drive surface in which the potential has a minimum value in the PDA 201 and the PDB 202.

That is to say, the electrons generated in the separation region are accumulated in the PDA 201 and the PDB 202 together with the electrons generated in the PDA 201 and the PDB 202. In the seventh embodiment, this accumulation operation is referred to as a "separation region collection mode".

<Pixel Read Circuit/Read Operation>

Figure 20:
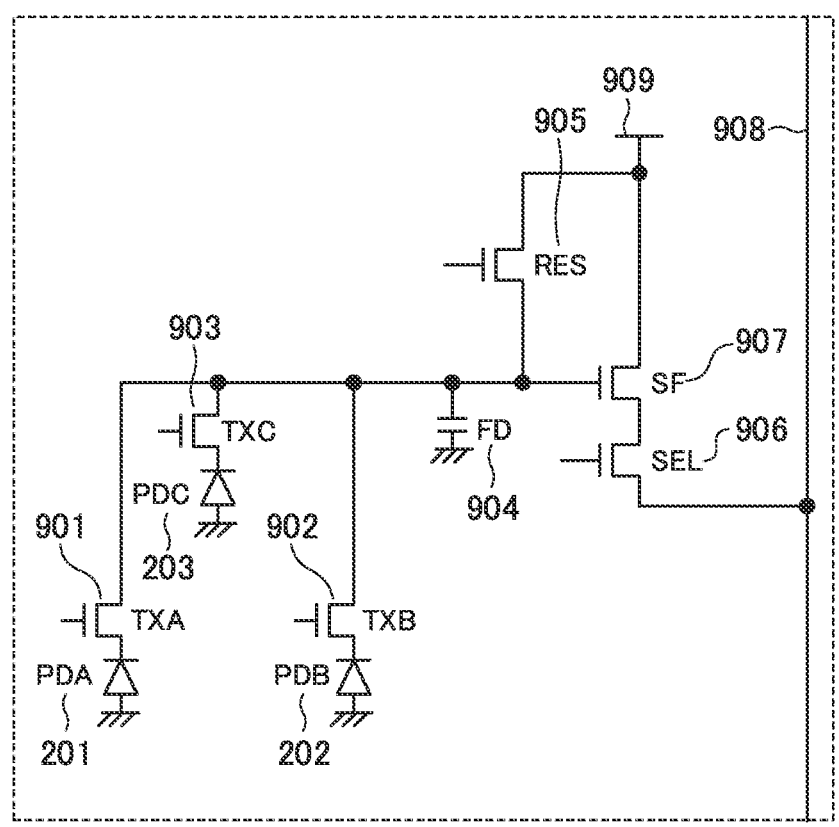
FIG. 20 is an equivalent circuit diagram of a pixel in the seventh embodiment.

Next, FIG. 20 is a schematic diagram illustrating an equivalent circuit of the pixel 200G in the seventh embodiment.

A charge/voltage converting unit (FD) 904 configured to convert a signal charge into a voltage, a transfer switch (TXA) 901 configured to transfer a signal charge in the PDA 201 to the FD 904, and a transfer switch (TXB) 902 configured to transfer a signal charge in the PDB 202 to the FD 904 are provided.

Also, a transfer switch (TXC) 903 configured to transfer a signal charge in the PDC 203 to the FD 904 and a reset switch (RES) 905 configured to discharge signal charges of the PD and reset the PD are provided.

Furthermore, a selection switch (SEL) 906 configured to select a read pixel, an amplification transistor (SF) 907 configured to output a signal voltage from a pixel, an output signal line 908, and a constant voltage source 909 are provided.

In addition, although not illustrated in FIG. 20, regions among the PDA 201 to the PDC 203 have the separation region 303 and the separation region control electrode 304 configured to control a transport destination thereof. Moreover, it is possible to transport the electric charges generated in the separation region 303 to the PDC or perform switching between the transporting of the electric charges generated in the separation region 303 to the PDA or the PDB. Furthermore, the TXC 903 may be omitted and the PDC 203 may be connected to the constant voltage source 909.

Figure 21:
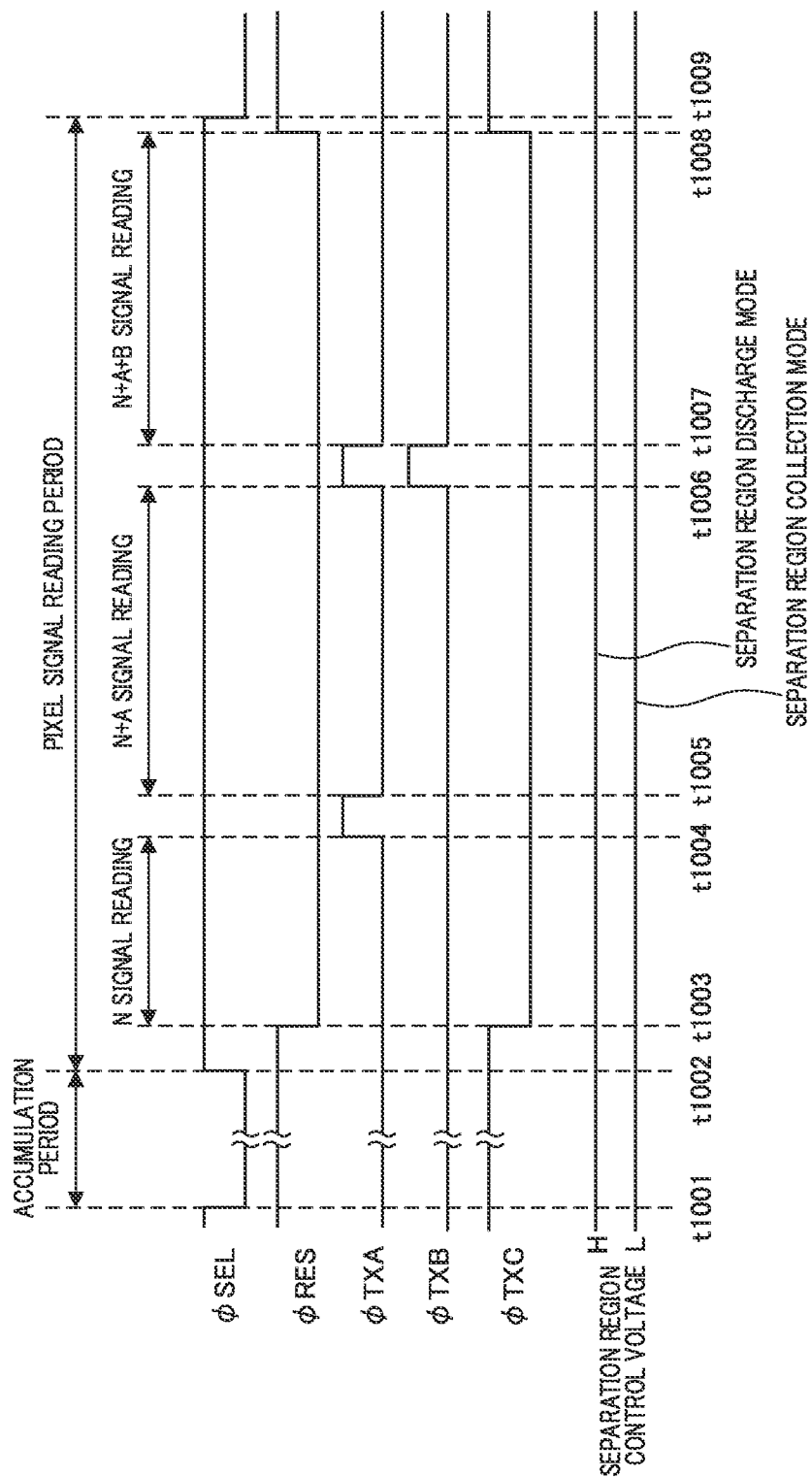
FIG. 21 is a timing chart for explaining an example of a timing at which a pixel is driven during an accumulation period and a pixel signal read-out period in the seventh embodiment.

FIG. 21 is a timing chart for explaining an example of a drive timing of a pixel during an accumulation period and a pixel signal read-out period in the seventh embodiment.

t1001 to t1009 in FIG. 21 indicate each timing in the timing chart, and in the seventh embodiment, each timing is shown like (t1001). Furthermore, for example, φSEL indicates tuning on/off of the SEL and indicates an H side (an upper side) at the time of turning on and an L side (a lower side) at the time of turning off. The same applies to other switches.

Also, the separation region control voltage in FIG. 21 shows the upper side is at a high voltage and the lower side is at a low voltage. The separation region control voltage during a pixel signal read-out period is the same as during the accumulation period in both the separation region discharge mode and the separation region collection mode, but may be changed. Furthermore, it is desirable to perform switching between the separation region accumulation mode and the separation region discharge mode, for example, before the accumulation period starts (t1001). In FIG. 21, the separation region discharge mode (the H side) is set during the accumulation period.

As illustrated in FIG. 21, a pixel signal read operation is the same regardless of the separation region collection mode/the separation region discharge mode during the accumulation period. That is to say, the pixel signal reading is composed of N signal reading, N+A signal reading, and N+A+B signal reading. An N signal corresponds to a noise signal corresponding to an FD voltage before the electric charges accumulated in the PD is transferred.

An N+A signal is a signal corresponding to an FD voltage after the electric charges accumulated in the PDA 201 during the accumulation period transferred to the FD 904 and includes the above-described N signal. An N+A+B signal is a signal corresponding to an FD signal after the electric charges are transferred to the FD 904 together with the electric charges accumulated in the PDA 201 and the PDB 202 during the accumulation period and also includes the N signal.

A pixel operation during an accumulation period and a pixel signal read-out period will be described below.

<Accumulation Period (t1001 to t1002)>

During an accumulation period, an SEL 906 is turned off and the SF 907 and the output signal line 908 are separated. Furthermore, in FIG. 21, during the accumulation period, the separation region discharge mode (the H side) is set and the RES 905 and the TXC 903 are turned on. Therefore, the signal charges collected in the PDC 203 along the valley or the groove of the separation region 303 are discharged from the pixel via the TXC 903, the FD 904, and the RES 905.

On the other hand, although the TXC 903 discharges the electric charges in the PDC 203 by turning on the TXC 903 during the accumulation period, the electric charges collected in the PDC 203 along the groove of the separation region 303 are small in the separation region collection mode. Thus, the TXC 903 may be turned off.

<Pixel Signal Read-Out Period (t1002 to t1009)>

After the accumulation period ends, the SEL is turned on. Thus, the SF 907 and the output signal line 908 are connected (t1002). Subsequently, the RES 905 and the TXC 903 are turned off (t1003). A voltage corresponding to the potential of the FD 904 after that is read out, as an N signal, from the pixel to the output signal line 908 via the SF 907 (t1003 to t1004).

Subsequently, the TXA 901 is turned on (t1004)/off (t1005), the signal charges accumulated in the PDA during the accumulation period are transferred to the FD 904, and the potential of the FD drops down in accordance with an amount of transferred electric charges. A voltage corresponding to the FD voltage after that is read out, as an N+A signal, from the pixel via the SF 907 (t1005 to t1006).

Subsequently, the TXA 901 and the TXB 902 are turned on (t1006)/off (t1007), the signal charges accumulated in the PDB during the accumulation period are transferred to the FD 904, the potential of the FD drops down in accordance with the amount of transferred electric charges. A voltage corresponding to the FD voltage after that is read out, as an N+A+B signal, from the pixel via the SF 907 (t1007 to t1008).

Subsequently, the RES 905 and the TXC 903 are turned on (t1008), the PDC 203 is connected to a power supply voltage, the residual electric charges in the PDC 203 and the FD are removed, and then the SEL 906 is turned off (t1009). Thus, the SF 907 and the output signal line 908 are separated and the pixel signal read-out period ends.

A signal A corresponding to the amount of electric charges accumulated in the PDA 201 is obtained by calculating the difference between the N signal and the N+A signal among the signals obtained through the above-described operation. Furthermore, a signal B corresponding to the amount of electric charges accumulated in the PDB 202 is obtained by calculating the difference between the N+A signal and the N+A+B signal. The signal A and the signal B are parallax signals and used for focus detection. On the other hand, a signal A+B obtained by adding the signal A and the signal B is an imaging signal and is used for image display and the like.

<Acquisition of Imaging Signal/Phase Difference Signal>

A correspondence between the pixel structure and the pupil division in the seventh embodiment will be described below with reference to FIGS. 22A and 22B and the like.

Figure 22A:
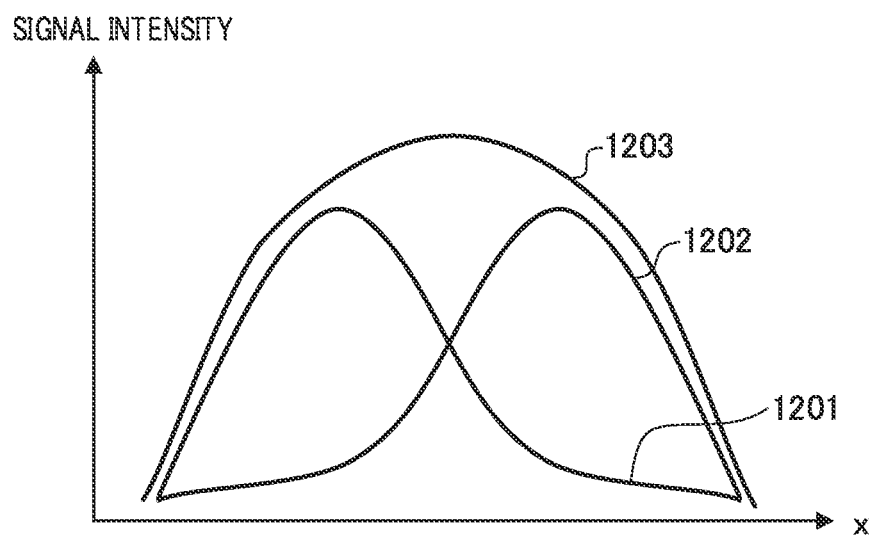
FIGS. 22A and 22B are schematic diagrams illustrating a pupil intensity distribution in the seventh embodiment.
Figure 22B:
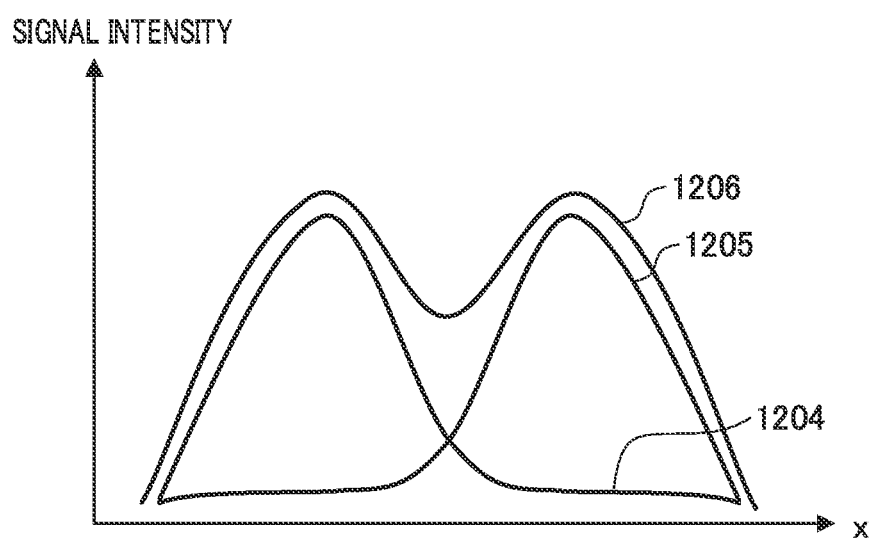

FIGS. 22A and 22B are diagrams illustrating an example of a pupil intensity distribution which is a signal intensity along the x axis in the exit pupil surface in the seventh embodiment, FIG. 22A illustrates an example of a pupil intensity distribution in the separation region collection mode, and FIG. 22B illustrates an example of a pupil intensity distribution in the separation region discharge mode.

In FIGS. 22A and 22B, the signal A is indicated by reference numerals 1201 and 1204, the signal B is indicated by reference numerals 1202 and 1205, and the signal A+B is indicated by reference numerals 1203 and 1206.

When a large amount of defocus is provided, amounts of blurring of an A image and an B image also increase in the separation region discharge mode. Thus, the signal intensity distributions of the A image and the B image are easily differentiated.

That is to say, the large amount of defocus is provided, the amounts of blurring of the A image and the B image also increase. Thus, the signal intensity distributions of the A image and the B image are easily differentiated. In addition, in the separation region collection mode, the reliability value at the time of calculating the amount of image deviation easily increases. That is to say, the accuracy of the amount of defocus easily deteriorates.

As described above, in the focus detection calculation (the calculation of the amount of image deviation), an amount of deviation with the smallest sum of squares (reliability value) of the difference between the A image signal and the B image signal for each pixel when a relative positions of the A image signal and the B image signal deviate is defined as an amount of image deviation (an amount of defocus).

Also, the above-described reliability value is also acquired as a value for determining the reliability and the accuracy of the amount of defocus. That is to say, in this embodiment, when the value of this reliability value decreases, the accuracy of image deviation amount calculation increases.

Although the reliability value is used a value indicating a focus detection state, the value indicating the focus detection state is not limited to the above-described reliability value, and for example, the similarity in shape, a level difference, and the like of the A image signal and the B image signal may be used.

On the other hand, in the separation region discharge mode, an incident angle range of the light accumulated in each of the PDA (the A image) and the PDB (the B image) can be narrowed. Thus, the amounts of blurring of the A image and the B image decrease and the reliability value at the time of calculating the amount of image deviation deteriorates.

That is to say, the accuracy of the amount of defocus is increased. For this reason, when the amount of defocus is large, it is possible to acquire a signal suitable for focus detection in the separation region discharge mode.

Also, when an image is acquired, unnatural blurring is not easily generated in the separation region collection mode as compared with the separation region discharge mode.

Therefore, in the seventh embodiment, it is possible to optimally perform switching between the acquisition of an imaging signal with minimized unnatural blurring and a signal suitable for focus detection by performing switching between the separation region discharge mode and the separation region collection mode depending on whether the amount of defocus is detected (focus detection) or the image is acquired.

As described above, in the imaging device in this modified example, it is possible to perform switching between the acquisition of an imaging signal with minimized unnatural blurring and a signal suitable for focus detection by performing switching between the separation region collection mode and the separation region discharge mode while minimizing an influence on the PDA 201 and the PDB 202.

<Camera Operation Sequence>

Figure 23:
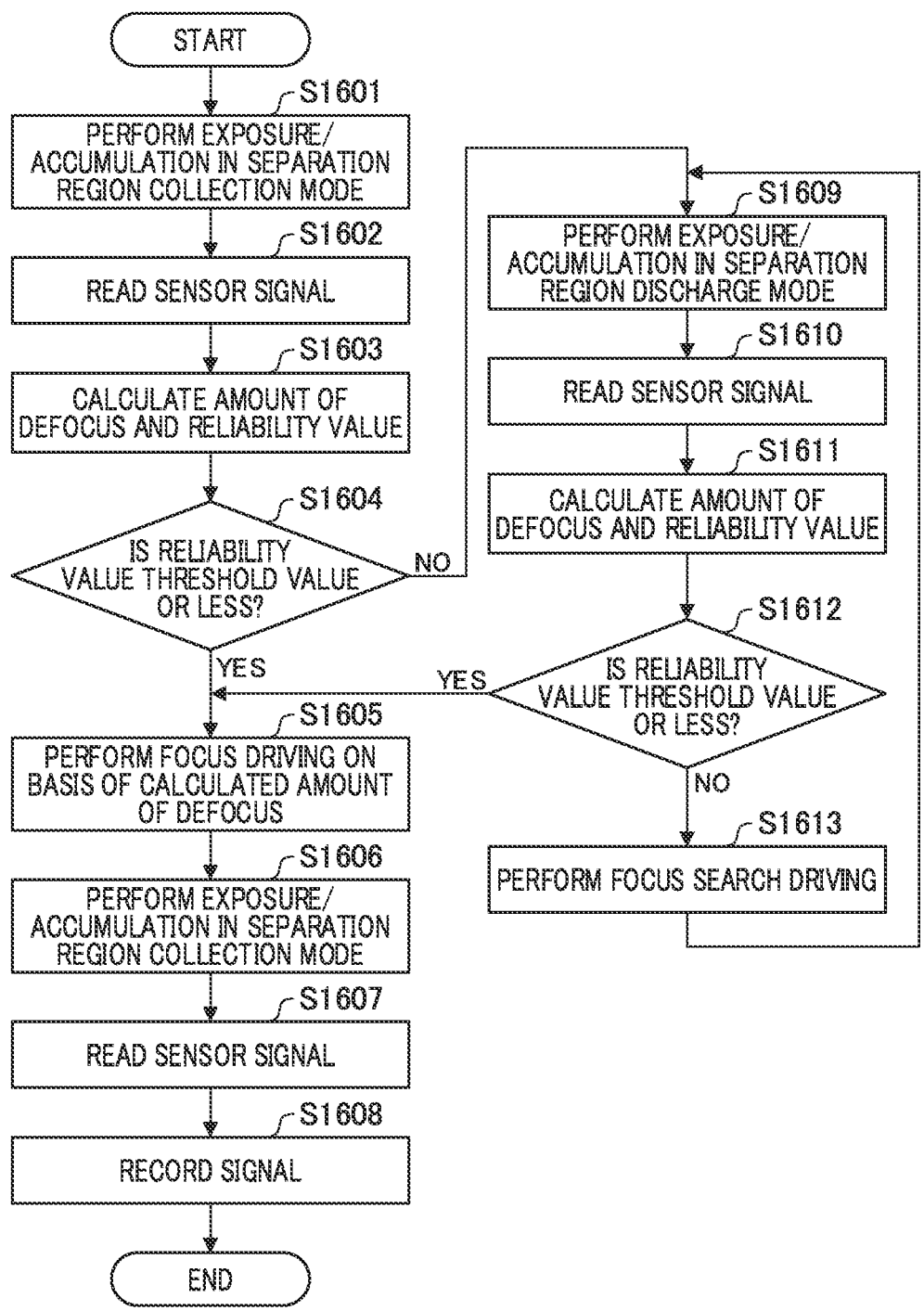
FIG. 23 is a flowchart for describing an operation of AF one-shot photographing performed in the seventh embodiment.

FIG. 23 is a diagram illustrating an example of a flowchart for describing an AF one-shot photographing performed in the seventh embodiment and the AF one-shot photographing will be described with reference to FIG. 23. A configuration of an imaging apparatus is the same as that illustrated in FIG. 12.

A flow of FIG. 23 starts when an imaging instruction switch SW2 is fully pressed in a state in which a photographing mode is set to an AF one-shot photographing mode by a user operation of the operation unit 1507.

First, in Step S1601, exposure/accumulation is performed in the separation region collection mode.

Subsequently, a signal is read from the imaging device 100 in Step S1602 and an amount of defocus and a reliability value of the amount of defocus are calculated in Step S1603. That is to say, the process of Step S1603 functions as a reliability value calculation unit configured to calculate a reliability value of focus detection in a focus detection unit.

In Step S1604, if the reliability value calculated in Step S1603 is lower than a predetermined threshold value (if the accuracy of the amount of defocus is high), the process proceeds to the process of Step S1605. In addition, if the reliability value is higher than a predetermined threshold value, the process proceeds to the process of Step S1609.

In Step S1609, exposure/accumulation is performed in the separation region discharge mode. That is to say, in Steps S1604 and S1609, the voltage control unit changes the voltage applied to the separation region control electrode on the basis of the reliability value. In Step S1610, a signal is read from the imaging device 100, and in Step S1611, the amount of defocus and the reliability value are calculated again. That is to say, the process of Step S1611 also functions as a calculation unit configured to calculate a focus detection state (a reliability value) in the focus detection unit.

A reliability value is calculated in Step S1611 on the basis of the signal exposed/accumulated in the separation region discharge mode in which an angle of incidence of the light of the A image/the B image to be collected is narrow. The calculated reliability value is smaller than the reliability value calculated in Step S1603 on the basis of the signal accumulated in the separation region collection mode in which the angle of incidence of the light of the A image/the B image to be collected is wide. That is to say, the accuracy of the amount of defocus is increased.

In Step S1612, if the reliability value calculated in Step S1611 is higher than a predetermined threshold value (if the accuracy of the amount of defocus is low), the process proceeds to the process of Step S1605. Furthermore, if the reliability value is lower than a predetermined threshold value (if the accuracy of the amount of defocus is high), the process proceeds to the process of Step S1613.

In Step S1613, the lens drive unit 1502 is used to move a focus position by a predetermined range in a predetermined direction to search for a peak of a contrast value of an image regardless of the calculated amount of defocus. Thus, a so-called focus search drive used for searching for a focused position is performed and the process proceeds to the process of Step S1609.

In Step S1605, the image-forming lens is driven to the focus position on the basis of the amount of defocus calculated in Step S1603 or Step S1611 via the lens drive unit 1502 to focus on a subject.

Subsequently, exposure/accumulation is performed in the separation region collection mode in Step S1606, an A+B signal is read from the imaging device 100 as an image signal in Step S1607, and recording is performed in the recording unit 1506 in Step S1608. Furthermore, an image is displayed on the display unit 1505 as necessary.

In this way, in the case of the subject with a high reliability value of the amount of defocus calculated on the basis of the signal exposed/accumulated in the separation region collection mode (the accuracy of the amount of defocus is low), the amount of defocus calculated on the basis of the signal exposed/accumulated in the separation region discharge mode is used. Thus, the focus can be adjusted to a subject.

As described above, when an image for performing displaying or recording is acquired, if there is an insensitive region in the separation region between the photoelectric conversion elements which share the microlens (or the electric charges of the separation region are discharged), unnatural blurring occurs when out of focus. Therefore, it is desirable to have the sensitivity of the separation region (or to be used without discharging the electric charges of the separation region).

On the other hand, in the focus detection, if the separation region between the photoelectric conversion elements is sensitive, a shape difference in the signal intensity distribution between the focus detection signals may easily increase and a calculation error for the amount of image deviation required for focus detection may increase in some cases. For this reason, it is more desirable that there is no sensitivity of the separation region. However, the light receiving unit made of Si or the like receives light and generates electric charges. Thus, there is a problem that most of the electric charges generated at the time of receiving light are collected in a charge accumulation layer existing in the vicinity of the separation region.

Here, if a gate electrode (the separation region control electrode) along a division line of the photoelectric conversion element is disposed on the light receiving surface side, the separation region is controlled from the light incident surface. Thus, even if a transparent electrode is used, sensitivity loss occurs and unnatural blurring easily occurs when an image signal is acquired.

However, according to the configuration as in the seventh embodiment, it is possible to acquire an imaging signal (an image signal) in which unnatural blurring is minimized when the image is acquired. Moreover, when focus detection is performed, it is possible to obtain an effect that an imaging apparatus in which focus detection with a high accuracy can be performed can be obtained.

Eighth Embodiment

Figure 24:
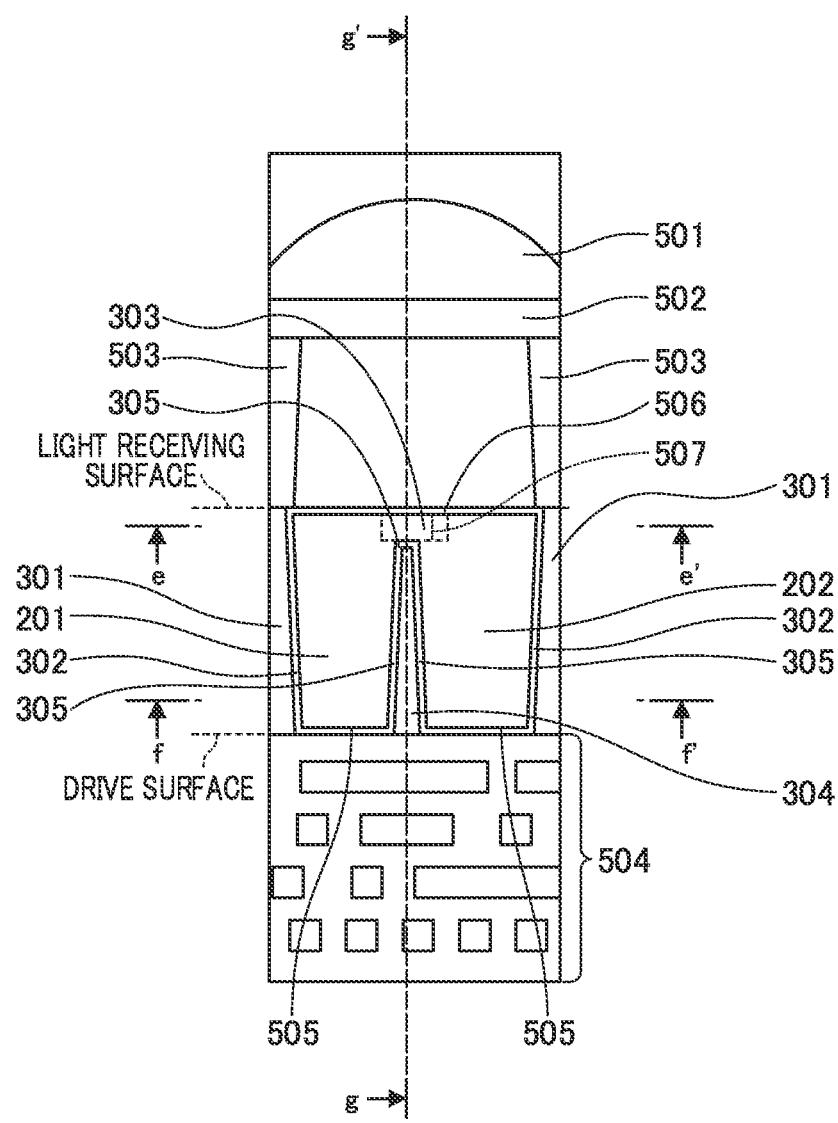
FIG. 24 is a cross-sectional view of an a-a' cross section in FIGS. 3A and 3B when viewed from a −y side in an eighth embodiment.

FIG. 24 is a cross-sectional view of the a-a' cross section in FIGS. 3A and 3B when viewed from the −y side in an eighth embodiment.

The eighth embodiment and the first embodiment described with reference to FIG. 4 differ in that, in the first embodiment, the impurity concentration of the p-type semiconductor in the separation region 303 is the highest at a center (a pixel center) of the separation region 303 in the x direction (a separation direction) and a center position of the separation region control electrode 304 in the x direction is also aligned with the pixel center. On the other hand, in the eighth embodiment, the impurity concentration of the p-type semiconductor in the separation region 303 is the highest in a region 507 deviated from the pixel center in the x direction.

Also, the center position of the separation region 303 in the x direction deviates from the pixel center (a peak position of the impurity concentration of the p-type semiconductor).

In this way, in the eighth embodiment, a region having the highest impurity concentration inside the separation region deviates from a center line of the separation region control electrode when viewed in the separation direction of the separation region.

The region having the highest impurity concentration inside the separation region and the center line of the separation region control electrode may be arranged on opposite sides of the pixel center when viewed in the separation direction.

Also, pixels of which a relative position of the region having the highest impurity concentration inside the separation region and the center line of the separation region control electrode are symmetrical with respect to the center of the light receiving unit may be provided.

Furthermore, pixels of which a relative positions of the region having the highest impurity concentration inside the separation region and the center line of the separation region control electrode are symmetrical with respect to the center of the light receiving unit may be alternatively arranged for each prescribed number rows.

Figure 25A:
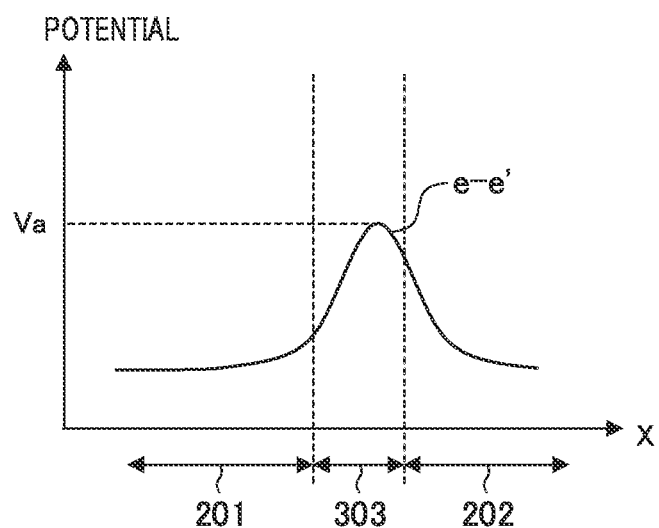
FIGS. 25A and 25B are schematic diagrams illustrating potential distributions in a line segment shown by e-e' and in a pixel in FIG. 24 in the eighth embodiment.
Figure 25B:
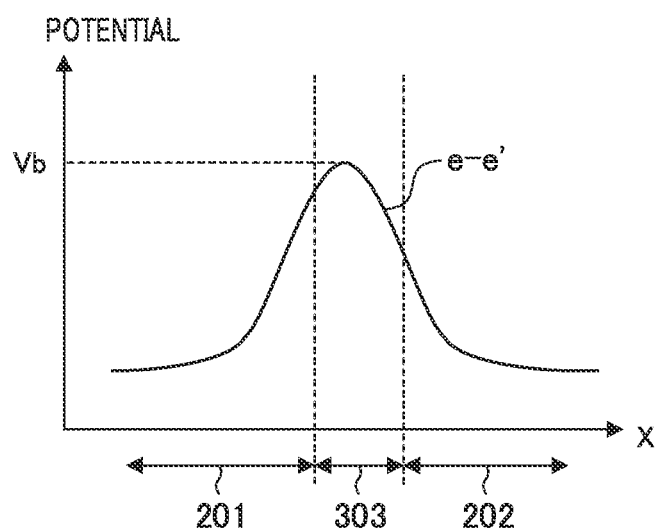

FIGS. 25A and 25B are schematic diagrams illustrating a potential distribution of Si in the line segment shown in e-e' in FIG. 24, FIG. 25A illustrates a case in which the voltage of the separation region control electrode 304 is relatively low, and FIG. 25B illustrates a case in which the voltage of the separation region control electrode 304 is relatively high.

As illustrated in FIGS. 25A and 25B, a potential in the separation region 303 in the x direction is maximized can be moved in the x direction by changing the voltage applied to the separation region control electrode 304 using the voltage control unit.

The electrons generated in the separation region 303 are distributed to the PDA 201 and the PDB 202 using a position in which the potential in the separation region 303 in the x direction is maximized as a boundary. Furthermore, the electrons are transported in the −z direction and accumulated in the vicinity of a place in which the potentials in the PDA 201 and the PDB 202 have minimum values.

When the application voltage of the separation region control electrode 304 is changed, a position in which a potential is maximized can be moved in the x direction and a division position in which the electric charges generated in the separation region 303 are distributed to the PDA 201 and the PDB 202 can be changed.

Figure 26:
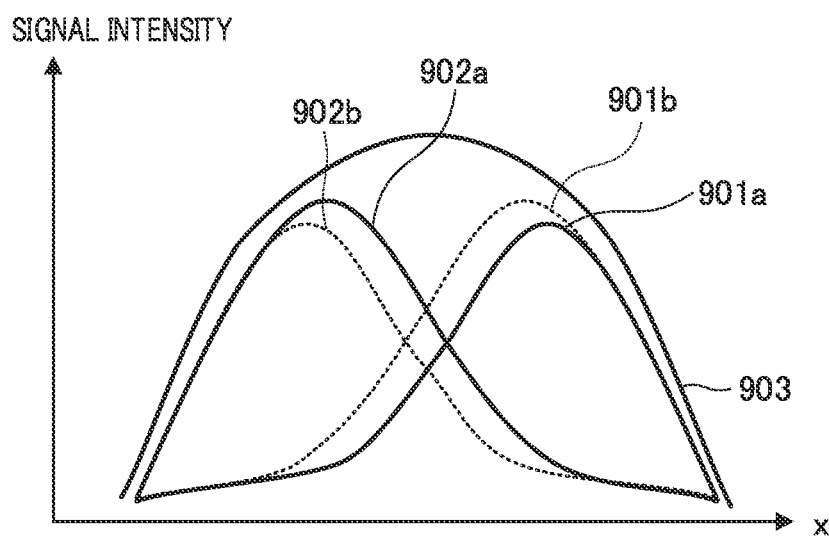
FIG. 26 is a schematic diagram illustrating a pupil intensity distribution in the eighth embodiment.

A correspondence between a pixel structure and pupil division in this embodiment will be describe with reference to FIG. 26.

FIG. 26 is a diagram illustrating an example of a pupil intensity distribution which is a signal intensity along the x axis in an exit pupil surface in the eighth embodiment. In FIG. 26, pupil intensity distributions of the PDA 201 and the PDB 202 when the application voltage of the separation region control electrode 304 corresponding to FIG. 25A is low are denoted by reference symbols 901a and 902a.

Also, pupil intensity distributions of the PDA 201 and the PDB 202 when the application voltage of the separation region control electrode 304 corresponding to FIG. 25B is high are denoted by reference symbols 901b and 902b. A pupil intensity distribution obtained by adding the pupil intensity distributions of the PDA 201 and the PDB 202 is denoted by reference numeral 903.

In this way, in the eighth embodiment, a distribution position of the electrons generated in the separation region 303 using the application voltage of the separation region control electrode 304 can be moved in the x direction. Thus, a pupil division position in the pupil division region 1103 can be changed.

Only the structure of the separation region control electrode in the cross section structure illustrated in FIG. 24 may be changed as in the third and fourth embodiments.

Ninth Embodiment

Figure 27:
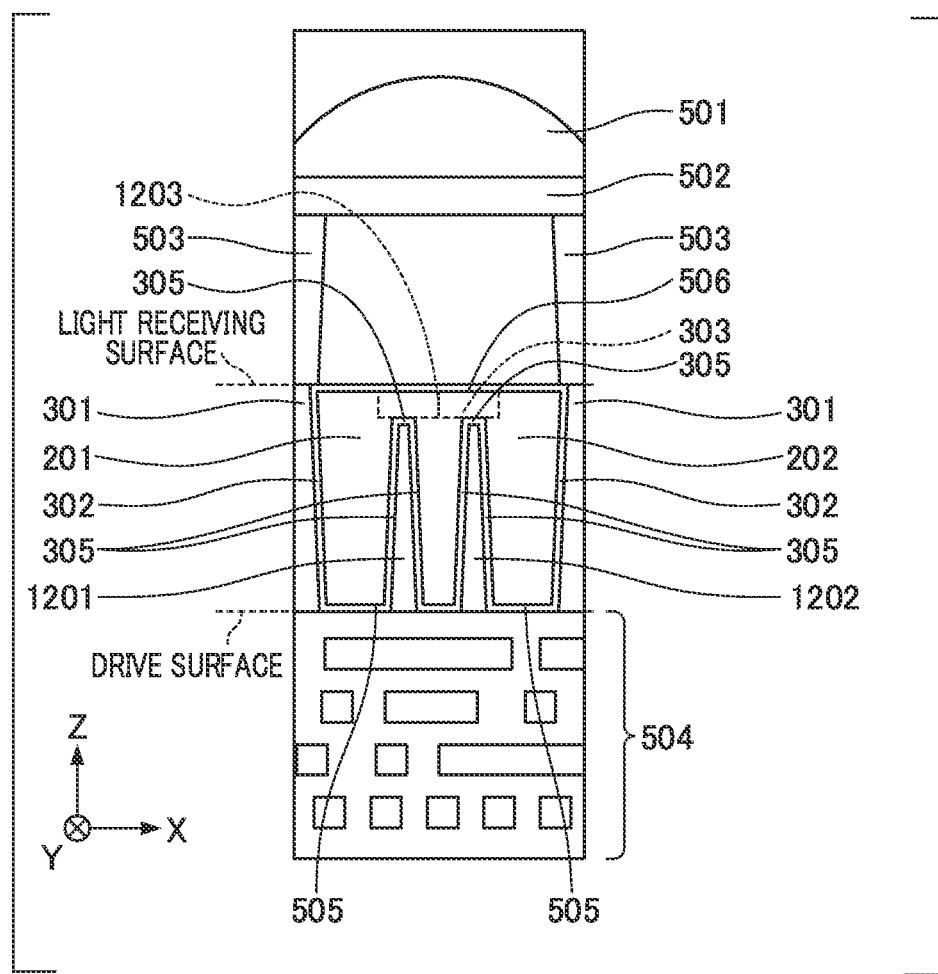
FIG. 27 is a cross-sectional view of a pixel in a ninth embodiment.

Although one separation region control electrode is provided in one pixel as illustrated in FIG. 24 in the eighth embodiment, in a ninth embodiment, the number of separation region control electrodes in FIG. 24 is changed to two. FIG. 27 is a cross-sectional view of a pixel in the ninth embodiment and the ninth embodiment will be described with reference to FIG. 27.

In the ninth embodiment, a separation region control electrode is disposed to be divided into two electrodes such as a separation region control electrode 1201 on a side having an x coordinate smaller than that of the pixel center and a separation region control electrode 1202 on a side having an x coordinate larger than that of the pixel center, which can independently apply different voltages.

The separation region 303 is arranged to straddle the two separation region control electrodes 1201 and 1202 and the impurity concentration of a pixel center region 1203 is the highest in the x direction.

A region in the separation region 303 to which an electric yield is applied is wider in the x direction than that in the eighth embodiment. Thus, an amount of change in peak position of a potential can be increased and a pupil division position can increase an amount of displacement in the pupil division region 1103.

As described above, in the imaging device in the ninth embodiment, the position of the pupil division can be changed in a wider range than that in the eighth embodiment.

In the ninth embodiment, a relationship between a sensor pupil distance and a lens exit pupil distance and a pupil intensity distribution will be described below with reference to FIG. 28.

Figure 28:
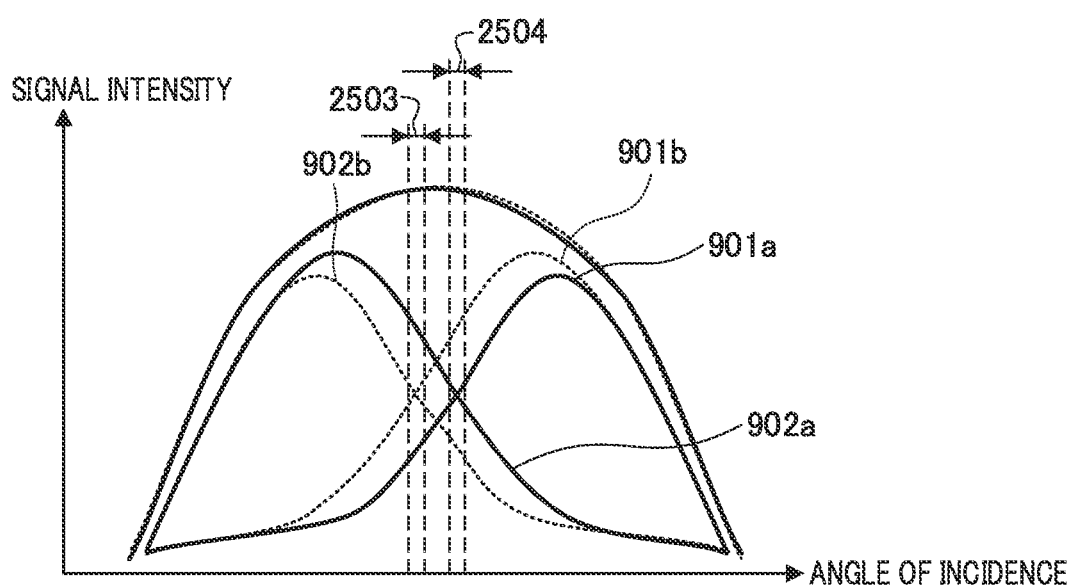
FIG. 28 is a schematic diagram illustrating potential distributions in the pixels in the eighth and ninth embodiments.

FIG. 28 is a diagram illustrating an example of the pupil intensity distributions in the eighth and ninth embodiments.

As described with reference to FIG. 14, when an optical diaphragm of the installed image-forming lens is denoted by reference numeral 1008, a line 1006 connecting a center of the diaphragm aperture to a pixel 200G represents an incident light axis and light having an angle width 1001 is incident on the pixel 200G through the diaphragm aperture. At this time, an optical diaphragm 1008 and a light receiving surface of the image-forming lens are separated by a lens exit pupil distance 1004.

In this state, the incident light corresponds to, for example, an angle width 2503 in FIG. 28 and a phase difference needs to be detected using a difference in the center of gravity of intensity waveforms of a PDA signal and a PDB signal cut out with this angle width.

However, if the pupil intensity distributions of the PDA 201 and the PDB 202 are denoted by reference symbols 901a and 902a in FIG. 28, at that time, the difference in the center of gravity of the intensity waveforms decreases and the accuracy of phase difference detection decreases.

The difference in the center of gravity increases at angles at which the signal intensities of the PDA 201 and the PDB 202 are close to each other in the pupil intensity distribution. Thus, in this embodiment, the application voltage of the separation region control electrode 304 decreases and the pupil intensity distributions of the PDA 201 and the PDB 202 are shifted to the positions indicated by reference symbols 901b and 902b in FIG. 28. Thus, the difference in the center of gravity can be increased and the accuracy of detecting the phase difference can be improved.

Similarly, when the optical diaphragm 1008 and the light receiving surface of the installed image-forming lens are separated by the sensor pupil distance 1003 or when a distance between the sensor pupil surface and the light receiving surface is denoted by reference numeral 1003, an incident light axis is denoted by reference numeral 1005 and an angle width at a position as illustrated in FIG. 28 is denoted by reference numeral 2504. In this case, in the ninth embodiment, when the pupil intensity distributions of the PDA 201 and the PDB 202 are shifted to the positions indicated by reference symbols 901a and 902a in FIG. 28 by increasing the application voltage of the separation region control electrode 304, the difference in the center of gravity can be increased and the phase difference detection accuracy can be improved.

In this way, in the imaging device and the imaging apparatus in the eighth and ninth embodiments, when the application voltage of the separation region control electrode 304 is changed in accordance with the position of the optical diaphragm of the image-forming lens and the sensor pupil distance, the difference in the center of gravity can be increased under each optical condition. Thus, it is possible to improve the phase difference detection accuracy.

In the above description, each unit in this embodiment may include a discrete electronic circuit or a part or all thereof may be configured of an FPGA, a CPU, and the like, or using a computer program.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

A computer program which realizes the functions of the above-described embodiment with a part or all of the control in this embodiment may be supplied to the imaging apparatus over a network or various storage media. Moreover, the computer (or a CPU, an MPU, or the like) in the imaging apparatus may read and execute the program. In this case, the program and the storage medium that stores the program constitute the present invention.

This application claims the benefit of Japanese Patent Application No. 2020-40210 filed on Mar. 9, 2020, which is hereby incorporated by reference herein in its entirety.

What is claimed is:

1. An imaging device, comprising:
a light receiving unit provided on a first surface side of a semiconductor substrate and having a plurality of pixels arranged in a two-dimensional form; and
a read-out circuit provided on a second surface side of the semiconductor substrate opposite to the first surface side and configured to read signals from the pixels,
wherein each of the pixels has at least two photoelectric conversion elements and a separation region which is a region between the two photoelectric conversion elements, and
a separation region control electrode arranged on the second surface side of the separation region and configured to control a potential of the separation region.

2. The imaging device according to claim 1, wherein the separation region control electrode includes a metal or a polysilicon which is in contact with a semiconductor constituting the light receiving unit.

3. The imaging device according to claim 2, wherein an insulating film is provided between the separation region control electrode and a part of the semiconductor region constituting the light receiving unit.

4. The imaging device according to claim 1, wherein the separation region control electrode includes a semiconductor of a conductive type different from that of the photoelectric conversion elements.

5. The imaging device according to claim 1, wherein each of the pixels has a color filter and a length of the separation region control electrode in a depth direction of the light receiving unit differs for each color filter.

6. The imaging device according to claim 1, comprising:
a drain region connected to the separation region and configured to discharge electric charge of the separation region.

7. The imaging device according to claim 6, wherein the pixel has a rectangular shape when viewed from an object side and the drain region is arranged on a corner side in the pixel.

8. The imaging device according to claim 6, wherein a position of the drain region in the pixel differs with respect to a center of the light receiving unit, wherein the center is a point at which an optical axis of an imaging optical system configured to form an optical image on the light receiving unit intersects the light receiving unit.

9. The imaging device according to claim 1, wherein the separation region has a concentration distribution of impurities therein and a region having the highest impurity concentration inside the separation region deviates from a center line of the separation region control electrode when viewed in a separation direction of the separation region.

10. The imaging device according to claim 9, wherein the region having the highest impurity concentration inside the separation region and the center line of the separation region control electrode are arranged on opposite sides with respect to the pixel center when viewed in the separation direction.

11. The imaging device according to claim 9, wherein pixels of which a relative position of the region having the highest impurity concentration inside the separation region and the center line of the separation region control electrode are symmetrical with respect to a center of the light receiving unit are provided.

12. The imaging device according to claim 9, wherein pixels of which a relative position of the region having the highest impurity concentration inside the separation region and the center line of the separation region control electrode are symmetrical with respect to the center of the light receiving unit are arranged alternatively for each prescribed number of rows.

13. The imaging apparatus according to claim 9, wherein a region having the highest potential inside the separation region is moved in a separation direction of the separation region by changing the voltage applied to the separation region control electrode using the voltage control unit.

14. An imaging apparatus, comprising:
an imaging device which includes:
a light receiving unit provided on a first surface side of a semiconductor substrate and having a plurality of pixels arranged in a two-dimensional form; and
a read-out circuit provided on a second surface side of the semiconductor substrate opposite to the first surface side and configured to read signals from the pixels, wherein
each of the pixels has at least two photoelectric conversion elements and a separation region which is a region between the two photoelectric conversion elements, and
a separation region control electrode arranged on the second surface side of the separation region and configured to control a potential of the separation region,
wherein the imaging apparatus including:
at least one processor or circuit configured to function as:
a voltage control unit configured to control a potential of the separation region by controlling a voltage applied to the separation region control electrode of the imaging device.

15. The imaging apparatus according to claim 14, comprising:
a focus detection unit configured to perform focus detection with a pupil division phase difference method using signals photoelectrically converted by the two photoelectric conversion elements.

16. The imaging apparatus according to claim 15, wherein the voltage control unit controls the voltage applied to the separation region control electrode so that pupil division characteristics in the focus detection unit are controlled.

17. The imaging apparatus according to claim 16, wherein the pupil division characteristics include the pupil intensity distribution characteristics on the photoelectric conversion elements.

18. The imaging apparatus according to claim 16, wherein the pupil division characteristics include the shading characteristics of a signal obtained from the photoelectric conversion elements.

19. The imaging apparatus according to claim 16, wherein the pupil division characteristics include characteristics depending on a relationship between an exit pupil distance of an imaging optical system configured to form an optical image on the light receiving unit and a sensor pupil distance of the imaging device.

20. The imaging apparatus according to claim 19, wherein, when a difference between the exit pupil distance and the sensor pupil distance is relatively large, the voltage control unit applies a voltage larger than that when the difference is relatively small to the separation region control electrode.

21. The imaging apparatus according to claim 14, wherein the voltage control unit changes the voltage applied to the separation region control electrode depending on an imaging optical system configured to form an optical image on the light receiving unit.

22. The imaging apparatus according to claim 14, wherein the voltage control unit changes the voltage applied to the separation region control electrode in accordance with a distance from a center of the light receiving unit.

23. The imaging apparatus according to claim 14, wherein electric charge in the separation region is discharged to a prescribed drain region by applying a prescribed voltage to the separation region control electrode using the voltage control unit.

24. The imaging apparatus according to claim 23, wherein, when the prescribed voltage is applied to the separation region control electrode using the voltage control unit, a groove-like potential for discharging electric charges generated in the separation region to the prescribed drain region is formed in the separation region.

25. The imaging apparatus according to claim 23, wherein switching is performed between distributing the electric charges generated in the separation region to the two photoelectric conversion elements and discharging the electric charges generated in the separation region to the prescribed drain region in accordance with the voltage applied to the separation region control electrode using the voltage control unit.

26. The imaging apparatus according to claim 14, comprising:
a calculation unit configured to calculate a focus detection state in the focus detection unit,
wherein the voltage control unit changes the voltage applied to the separation region control electrode on the basis of the focus detection state.

27. The imaging apparatus according to claim 14, wherein an imaging optical system configured to form an optical image on the light receiving unit is included in a lens barrel which is detachable from the imaging apparatus.

* * * * *